US012170252B2

United States Patent
Shan et al.

(10) Patent No.: US 12,170,252 B2
(45) Date of Patent: Dec. 17, 2024

(54) ELECTRONIC SUBSTRATE STACKING

(71) Applicant: INTERNATIONAL BUSINESS MACHINES CORPORATION, Armonk, NY (US)

(72) Inventors: Lei Shan, Carmel, NY (US); Daniel Joseph Friedman, Sleepy Hollow, NY (US); Griselda Bonilla, Hopewell Junction, NY (US); John Knickerbocker, Monroe, NY (US)

(73) Assignee: International Business Machines Corporation, Armonk, NY (US)

( * ) Notice: Subject to any disclaimer, the term of this patent is extended or adjusted under 35 U.S.C. 154(b) by 543 days.

(21) Appl. No.: 17/449,280

(22) Filed: Sep. 29, 2021

(65) Prior Publication Data
US 2023/0098054 A1   Mar. 30, 2023

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4857* (2013.01); *H01L 23/15* (2013.01); *H01L 23/49822* (2013.01)

(58) Field of Classification Search
CPC . H01L 23/5389; H01L 21/4857; H01L 23/15; H01L 23/49822; H01L 23/147;
(Continued)

(56) References Cited

U.S. PATENT DOCUMENTS 5,162,240 A   11/1992   Saitou
5,350,886 A   9/1994   Miyazaki
(Continued)

FOREIGN PATENT DOCUMENTS

EP        4409635 A1      8/2024
WO   2023/052322 A1      4/2023

OTHER PUBLICATIONS

Notification of Transmittal of the International Search Report and the Written Opinion of the International Searching Authority, or the Declaration, Date of mailing Feb. 14, 2023, Applicant's or agent's file reference P202000616PCT01, International application No. PCT/EP2022/076755, 10 pages.

*Primary Examiner* — Evan G Clinton
(74) *Attorney, Agent, or Firm* — L. Jeffrey Kelly

(57) ABSTRACT

A base substrate, high-k substrate layers on the base substrate with discrete decoupling capacitors embedded, high density substrate layers on the high-k substrate layers supporting wiring and wiring spacing of less than 2 up to about 10 micron width, pitch connectivity between the upper surface of the base substrate and a lower surface of the set of high density substrate layers supports less than 50 up to about 300 micron pitch, the pitch connectivity on an upper surface of the set of high density substrate layers supports less than about 150 micron pitch. A method including attaching a set of metal posts at each contact on a lower surface of a set of high density substrate layers, attaching to a handler, attaching an interconnect layer to a base substrate, and attaching the set of high density substrate layers to the base substrate while aligning each metal post with a contact.

14 Claims, 21 Drawing Sheets

(51) Int. Cl.
*H01L 23/15* (2006.01)
*H01L 23/498* (2006.01)

(58) Field of Classification Search
CPC .......... H01L 23/49894; H01L 23/5383; H01L 23/49816; H01L 23/5385
See application file for complete search history.

(56) References Cited

U.S. PATENT DOCUMENTS

| | | | |
|---|---|---|---|
| 5,396,034 A | 3/1995 | Fujita | |
| 5,488,542 A | 1/1996 | Ito | |
| 5,534,466 A | 7/1996 | Perfecto | |
| 5,869,899 A | 2/1999 | Arledge | |
| 5,995,379 A | 11/1999 | Kyougoku | |
| 6,281,452 B1 | 8/2001 | Prasad | |
| 6,329,609 B1 | 12/2001 | Kaja | |
| 6,444,919 B1 | 9/2002 | Economikos | |
| 6,876,074 B2 | 4/2005 | Kim | |
| 6,998,327 B2 | 2/2006 | Danielson | |
| 7,141,916 B2 | 11/2006 | Takahashi | |
| 7,589,407 B2 | 9/2009 | Karnezos | |
| 7,811,854 B2 | 10/2010 | Gabara | |
| 8,580,581 B2 | 11/2013 | Sekine | |
| 9,648,740 B2 | 5/2017 | Wolf | |
| 2002/0180027 A1 | 12/2002 | Yamaguchi | |
| 2005/0136634 A1 | 6/2005 | Savastiouk | |
| 2007/0148819 A1 | 6/2007 | Haba | |
| 2007/0256859 A1 | 11/2007 | Kawakami | |
| 2016/0111380 A1 | 4/2016 | Sundaram | |
| 2016/0293581 A1* | 10/2016 | Lin | H01L 23/3157 |
| 2021/0134724 A1* | 5/2021 | Rubin | H01L 23/5385 |
| 2023/0087838 A1* | 3/2023 | Manepalli | H01L 23/5385 |
| | | | 438/126 |
| 2023/0253368 A1* | 8/2023 | Wu | H01L 24/95 |
| | | | 257/737 |
| 2023/0343685 A1* | 10/2023 | Wakazono | H01L 23/49822 |

* cited by examiner

Section A-A

Section A-A

Section A-A

ELECTRONIC SUBSTRATE STACKING

BACKGROUND

The present invention generally relates to electronic device assemblies, and more particularly to mechanically and electrically bonding substrates which contain electronic components.

Conventional methods of electronic device assemblies include attaching electronic components such multiple chips or chiplets to a multi-chip substrate and then assembling one or more substrates to a printed circuit board (PCB). The substrate may be an organic substrate, thin film organic layers and/or molded organic, silicon or glass interposer with through silicon vias (TSV), through glass vias (TGV) and wiring layers, ceramic substrate, combinations of the above substrates or alternate substrate material and structure. The printed circuit board may be comprised of core layers with pin through holes (PTH) for vertical connections and one or more wiring layers such as for power delivery and distribution and additional build up layers on either side of the core to provide additional higher density, horizontal wiring layers and vertical vias interconnection. The multi-layer ceramic carrier contains interconnections using vias, contact pads and connecting conductor wires or strips. Electronic components such as chips may be stacked using TSV or wirebonding or substrates may be stacked on another substrate using micro solder interconnections or micro ball grid array solder joints or solder and copper pillar arrays and substrates may be connected to PCB using larger ball grid arrays of solder such as a pitch greater than five hundred microns or by means of a multi-pin socket. There is a need for high bandwidth chip to chip or chiplet to chiplet interconnection, direct stacking of chips and/or substrates with higher density electrical interconnections, fine pitch wiring, large format packaging and adequate matching of coefficient of thermal expansion (CTE). These features can support high reliability in applications such as for Artificial Intelligence, Cloud Data Centers and other applications. Similarly, there is a need for high bandwidth chip or chiplet integration with smaller X-Y size format multi-chiplet integration such as for mobile communications applications and other applications.

SUMMARY

A composite substrate including a base substrate including a coefficient of thermal expansion (CTE) between 3 and 12 ppm/° Celsius, a surface area greater than 25 mm×25 mm, electrical connections on a lower surface, electrical connections on an upper surface, one or more wiring layers electrically connected between the lower surface and the upper surface, and a set of high density substrate layers electrically and mechanically connected to an upper surface of the base substrate, where each layer of the set of high density substrate layers includes wiring and vias which connect above and below each layer of the set of high density substrate layers, where each layer of the set of high density substrate layers supports wiring of less than 2 micron up to about 10 micron width, and less than 2 micron to about 10 micron space between wires, where a pitch connectivity between the upper surface of the base substrate and a lower surface of the set of high density substrate layers supports less than 50 micron up to about 300 micron pitch, where the pitch connectivity on an upper surface of the set of high density substrate layers supports less than about 150 micron pitch.

A composite substrate including a base substrate including a coefficient of thermal expansion (CTE) between 3 and 12 ppm/° Celsius, a surface area greater than 25 mm×25 mm, electrical connections on a lower surface, electrical connections on an upper surface, one or more wiring layers electrically connected between the lower surface and the upper surface, a set of high-k substrate layers electrically and mechanically connected to an upper surface of the base substrate, where each layer of the set of set of high-k substrate layers includes wiring and vias which connect above and below each layer of the set of high-k substrate layers, where a set of one or more discrete decoupling capacitors are embedded into the set of high-k substrate layers, and a set of high density substrate layers electrically and mechanically connected to an upper surface of the set of high-k substrate layers, where each layer of the set of high density substrate layers includes wiring and vias which connect above and below each layer of the set of high density substrate layers, where each layer of the set of high density substrate layers supports wiring of less than 2 micron up to about 10 micron width, and less than 2 micron to about 10 micron space between wires, where a pitch connectivity between the upper surface of the high-k substrate layers substrate and a lower surface of the set of high density substrate layers supports less than 50 micron up to about 300 micron pitch, where the pitch connectivity on an upper surface of the set of high density substrate layers supports less than about 150 micron pitch.

A method including attaching a set of metal posts at each contact on a lower surface of a set of high density substrate layers, attaching the set of high density substrate layers to a handler, attaching an interconnect layer to a base substrate, the interconnect layer including openings aligned with contacts on an upper surface of the base substrate, and attaching the set of high density substrate layers to the base substrate while aligning each metal post with a contact on the upper surface of the base substrate.

BRIEF DESCRIPTION OF THE DRAWINGS

The following detailed description, given by way of example and not intended to limit the invention solely thereto, will best be appreciated in conjunction with the accompanying drawings, in which.

Figure 1:
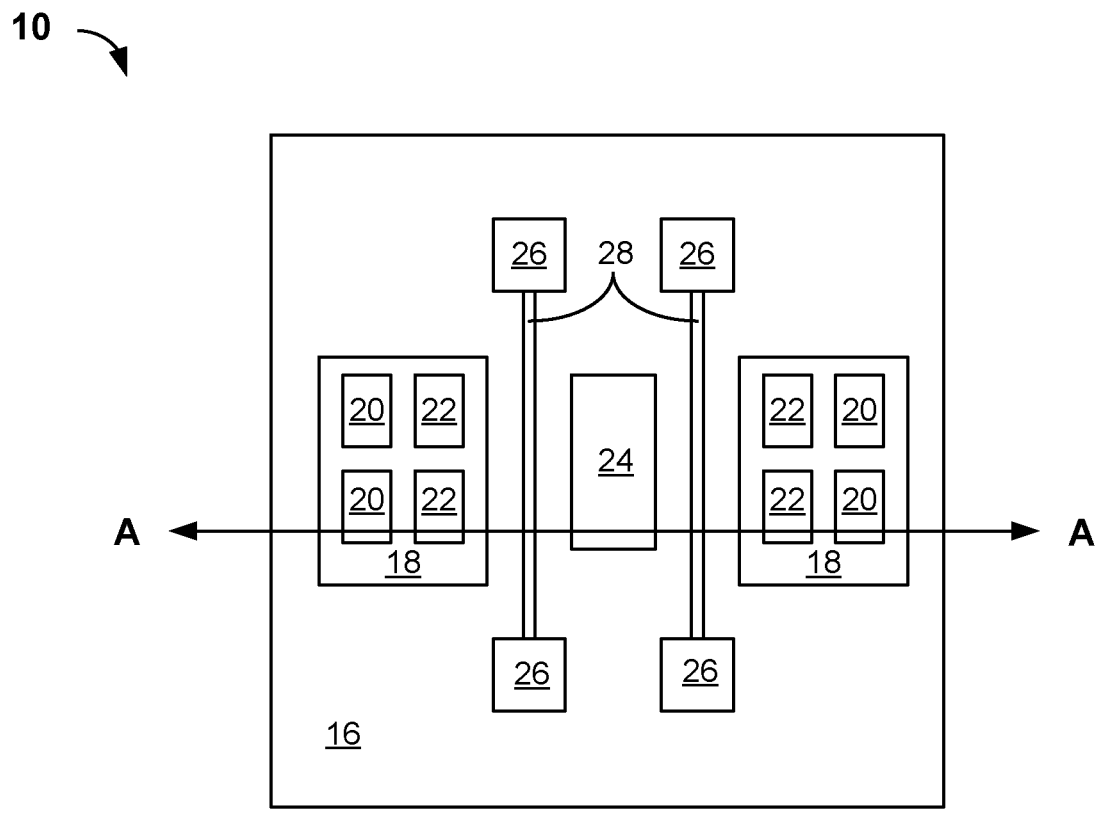
FIG. 1 is a top view of electronic components mounted on a substrate, according to an embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor packaging, and more particularly to mechanically and electrically bonding substrates which contain electronic components, photonic components and/or chips.

There is a need to enable direct stacking of electronic components and substrates including chips and chip stacks on a substrate which supports high density electrical interconnections, fine pitch wiring, large format packaging and adequate matching of coefficient of thermal expansion (CTE) without requiring conventional silicon interposer or packaging implementation such as with glass, ceramic or hybrid (mixed materials structures). Current higher CTE of about 18 ppm for organic substrates can limit the fine pitch interconnections for large chips and/or interposers from 400 mm$^2$ to about 3000 mm$^2$ due to mechanical reliability and/or assembly yield limitations, depending on the interconnections pitch for these chips and/or interposers, especially as the pitch of interconnection is reduced below 30 micron to 100 micron. This leads to a large CTE mismatch and therefore thermo-mechanical stress and strains, especially on the interconnections with largest distance from a neutral point.

For example, silicon components may have a CTE about 3 ppm/° Celsius. A ceramic base substrate may have a CTE ranging between 8 and 10 ppm/° Celsius, and may have a CTE as low as 3 ppm/° Celsius. A glass base substrate may have a CTE ranging between 3 and 12 ppm/° Celsius. A surface area of a base substrate may be increasing with more electronic components and may be 25 mm×25 mm, 50×50 mm, 100×100 mm and larger.

There is an industry shift to chiplet integration and segmented packaging to compliment the needs of multi-chip modules. Instead of a large system on a single electronic component or chip (system on chip—SOC), there is a shift to using segmented smaller size electronic components, chips or chiplets with discrete blocks of content or function each optimized for a different function. The different electronic components may come from different foundries and/or different nodes, resulting in a need for a hybrid or composite package with a combination of different types of electronic components, such as processors, accelerators, memory, memory chip stacks, and other types, each of which may have different power levels requirements. There may be different types of interconnects or metal posts on each electronic component, such as varying pitch between connections, varying number of connections and different bandwidth of a number of connections required between different electronic component combinations.

The chip may also be referred to as a chiplet, a die, a die stack, an integrated circuit, an electronic component, a component, an electronic device, a semiconductor device, or a device, among other references. The chip may be logic chip, a voltage reference device, a digital signal processor, a microprocessor, a microcontroller, a graphics processor, a memory device, a memory cube, a booting device, a radio frequency device, a high band width memory device, a discrete component or any other semiconductor device.

Industry shifts also include increasing a number of input/output signal lines between components. As the number of connections for input/output is increasing, the pitch is getting smaller, thereby reducing the spacing between each of the connections chip to package. For example, pitch size is decreasing from 100 micron, to 50 micron, to 30 micron, to 10 micron and smaller. As the pitch size decreases, flatness and rigidity requirements are more stringent with tight specifications, and increasing the need for both the chip side and the package to remain planar to maintain the integrity of the connections between the chip and package.

In addition, a size and form factor of packages are increasing to provide for more integration on modules for a combined packaged model, such that consumed energies can be kept to a lower level as opposed to having the chips or components individually packaged.

The above elements are driving a need for combining multiple chips of different sizes, power requirements, contact spacing, etc., onto a single package. In addition, there is a need for controlling thermal properties by minimizing differences in coefficient of thermal expansion between chips and the package, managing electrical needs and signals between chips. As chip requirements change over time, flexibility in packaging which may be better managed when combining multiple chips onto a single package.

An advantage of combining multiple chips onto a single package may be to segment different elements of the packaging technology, and then integrate those segments together, such as input/output requirements, processing, memory, etc.

There is a need for packaging which covers increasingly fine pitch wiring used in high bandwidth signal connections from chip to chip across the package, as well as providing different power or power delivery as required for each chip or chip sets at the right voltage and current level. Fine pitch wiring may be referred to as thin film wiring or fan out wiring for wafer level packaging. There is a need for packaging which also has flexibility of larger dimensions to mount several components into a more complex system, including heterogeneous components which different pitches, high current and decoupled power domains, while maintaining high reliability, rewardability and cost effectiveness.

Traditionally power is fed in from a back side of a package up through a package, with delivery to each of the chips or chip stacks. With a combination of different electronic components, each with different voltage and current requirements, the power may feed to each electronic component in both horizontal and vertical connections, increasing a total power consumption. Coarser wires may be needed for the power distribution, and as a package increases in size, the power distribution has to travel greater distances, required more wide wires for longer distance signal integrity. For example, signal lines may be 2 microns and are shrinking to 1 micron and smaller and the power lines may need to be greater than 2 microns, such as 4 microns. Spacing between signal lines may be 5 microns and smaller, 4 microns. Pitch may be shrinking from 150 microns to 100 microns, to 55 microns and 50 microns. A pitch connectivity on an upper surface of a set of high density substrate layers may support 100 micron pitch. A pitch connectivity between an upper surface of the base substrate and a lower surface of the set of high density substrate layers may support 100 micron pitch.

A composite substrate or composite module, where multiple chips are mounted in a single package is proposed which includes one or more integrated high density substrate layers (HDSL), secondary or lower density substrate layers (LDSL), optional additional layers and optional interconnections.

The HDSLs providing high density interconnection with fine pitch wiring and power delivery, distribution of circuitry and integrity of connections. The composite substrate allows for assembly integration which can include an on-package test platform, allow for mounting of dies, die stacks, chips, chip stacks, electronic components and selective ordering of mounting of chips with a preferred chip last mounted. The composite structure allows rework to replace defective components or integrated structures. The composite structure can support chip or multi-chip thermal cooling solutions and provide mechanical support for all components.

The LDSLs helps to define the composite substrates mechanical and thermal properties by supporting low density interconnects, coarse pitch wiring, and to control X-Y CTE. The LDSLs provide power delivery, distribution and integrity, multi-chip integration, and may provide a test platform. The LDSLs support possible addition of one or more high density substrate layers and support "known good substrates" of the high density and low density substrate layers. The LDSLs permit chips, chip stacks and component assembly integration (preferred chip last) and/or rework, and support chip, multi-chip thermal cooling integration/mechanical support to help create an integrated module, subsystem or system solution.

Each layer of the HDSL and of the LDSL may have mixed pitch and diameter vias, pads and interconnections, such as larger diameters to support higher power delivery for hot spots and higher power chips and smaller diameters for signal communications at high interconnection density. The HDSL and the LDSL may have segmented power planes and layers to optimize power delivery or interconnection to high k capacitive layers or structures, discrete capacitors or integrated voltage regulation dies to support heterogeneous integration of die, die stacks and components which may be from multiple foundries, using different notes of technology, different power levels and having different voltage specifications/limits for operation.

The HDSL and the LDSL may have electrical connections for test or power delivery, which may be opened by means of select wire or connection ablation such as with a laser and dielectric seal, local encapsulation or by alternate method leaving an altered structure with select wires or interconnections opened for purpose of test, yield, function or alternate application operation of the substrate or module.

The HDSL and the LDSL have optional structures to support mechanical structure enhancement or thermal cooling enhancements using heat sinks, caps, thermal vias, thermal wires, seal bands or other means to provide benefit to the yield, mechanical integrity, thermal cooling for the substrate and integrated die, dies stacks, components and thermal cooling structures for cost or product function or product reliability or other benefit to the product application.

The HDSL and the LDSL may have optional structures to provide artificial intelligence (AI) learning for improved build yield, assembly yield and/or functional optimization based on AI structure learning and enhancements in manufacturing.

The HDSL and the LDSL may have optional structures to support on Module optical links or electrical links from top, bottom and/or edge of substrate layers to support enhanced off substrate or module communication with other substrates/modules, memory storage, memory cards, subsystems or systems, etc.

The integrated HDSL built and assembled with chips, chip stacks, and electronic components can be bonded & tested with build-in self-test (BIST) test sites as part of the HDSL, and with test dies for full or partial assembly and function testing. The BIST test sites and test dies may be subsequently released from a handle wafer or a panel carrier. Tested integrated HDSL with known good sub-assembly can be used.

The optional additional layers may also include integrated or embedded components to provide high density embedded capacitance, integrated discrete capacitance, efficient power delivery and management, voltage regulation for one or more heterogeneous dies, die stacks or other components.

Optional interconnection may include optical link chips and/or waveguides or a chip set for "on module optical link" to off substrate or modules, to other modules, memory cards, subsystems or systems.

Embodiments of the composite substrate or composite module, where multiple chips are mounted in a single package include using a solder paste to implement interconnections, include using solder studs to implement interconnections, sequentially stacking layers using solder paste or solder studs. An embodiment includes using a HDSL and LDSL and verification of mechanical and electrical integrity of the composite substrate prior to chip attachment. An embodiment used copper-copper (Cu—Cu) bonding, copper pad/stud or pillar bonding, nickel/gold (Ni/Au) solder, under-bump metallurgy (UBM), or an alternate interconnect, injection molded solder (IMS) technology for via and or bump interconnection, or alternate electrical and/or thermal interconnection or sealing structures.

An embodiment uses testing of substrate layers for known good low density and high density layers, testing after assembly of low density and high density layers and/or rework to create known good stacked electronic substrate, testing of die, die stacks and/or components for known good die (KGD), assembly on or into a stacked electronic substrate with additional testing such as statistical partial testing or full testing to support multi-chips integration and/or rework to achieve high substrate and module yield.

Embodiments of the composite substrate or composite module, where multiple chips are mounted in a single package, are described in detail below by referring to the accompanying drawings FIGS. 1-24.

Figure 2:
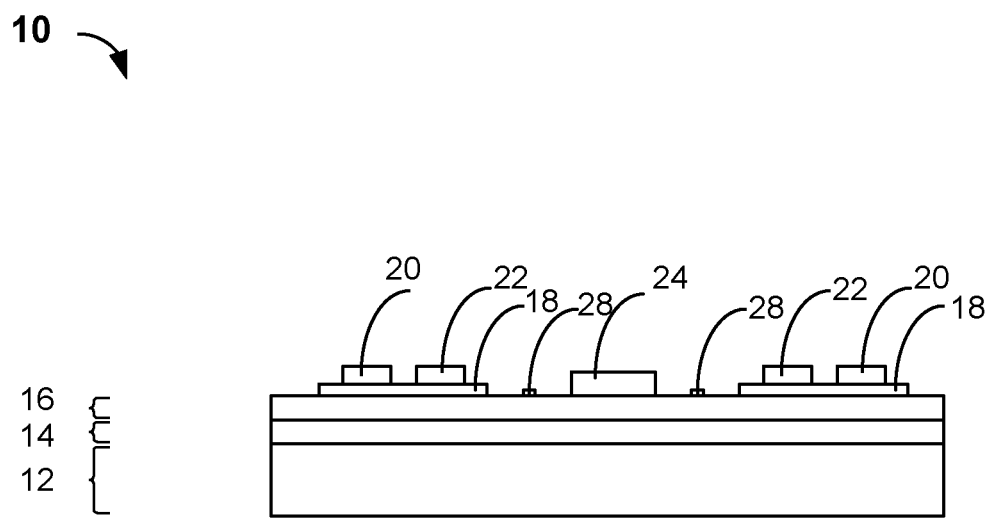
FIG. 2 is a side view of FIG. 1, along section line A-A, according to an embodiment.

Referring now to FIGS. 1 and 2, a package 10 of electronic components mounted on a substrate is shown, according to an exemplary embodiment. FIG. 1 is a top view of the package 10, while FIG. 2 is a side view of FIG. 1 along section line A-A. The package 10 includes a base substrate 12, a high-k substrate 14, an interconnect layer 16, a thin film substrate 18, an integrated circuit 20, a memory chip 22, a hub controller integrated circuit 24, a long reach input/out integrated circuit 26 and wires 28.

The base substrate 12 may be a multilayer ceramic substrate, silicon wafer, glass wafer or panel or alternate substrate, with a top surface and an array of electrical contact pads patterned on the top surface. Each of the layers of the multilayer substrate may have an array of electrical vias and wires of circuitry for connection to other layers of the base substrate 12 and to the electrical contact pads on the top surface of the base substrate 12. The base substrate 12 may be between 10 and 600-millimeter square or rectangular, or more, and may be between 1 and 10 millimeters thick, or more. There may be 20-30 layers in the base substrate 12, or more. Each of the layers may be ceramic with metallization for the vias, wiring and contact pads. An input/output pitch of the base substrate 12 may be between 150 and 200 micrometers on an upper surface and between 750 and 1000 micrometers on a bottom surface, although the input/output pitch may be greater or less on each upper, bottom surface. The materials of the base substrate 12 may be a combination of mixed/low CTE and high-k materials or embedded components.

The high-k substrate 14 may be conformally formed on the base substrate 12, covering an upper surface of the base substrate 12. The high-k substrate 14, may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an anisotropic vertical etch process such as a reactive ion etch (RIE), or any suitable etch process. In an embodiment, the high-k substrate 14 may include one or more layers. The high-k substrate 14 may include materials such as $HfO2$, $ZrO2$, $Al2O3$, $La2O3$, $TiO2$, $SrTiO3$, $LaAlO3$, $Y2O3$, $HfOxNy$, silicate thereof, and an alloy thereof. The high-k substrate 14 may be 2 nm thick. There are openings in the high-k substrate 14 corresponding to contact pads on an upper surface of the base substrate 12 that support vertical interconnections such as for low loss signal integrity electrical link communications through a low K dielectric. The high k substrate 14 supports decoupling capacitance such as for voltage regulation.

The interconnect layer 16 may be conformally formed on the base substrate 12, covering an upper surface of the high-k substrate 14. The interconnect layer 16, may include dielectric adhesive material or sheets. Examples of material used for the interconnect layer 16 include HD3007 from HD MicroSystems™, HD MicroSystems™ is a trademark of HD MicroSystems, L.L.C., Su-8 photoresister, PSPI, NCF, a B-Stage adhesive layer, or alternate materials. In an embodiment, the interconnect layer 16 may be between 1 and 120 microns thick. The interconnect layer 16 may provide electrical connections such as metal vias, vias with pads, vias with jogs, which may be formed of copper (Cu), solder and other conductive materials. The metal vias and jog may be single layer or multiple layer with vias form by lithography, etch, laser, copper (Cu) plating, solder plating, IMS or alternative means. The jog may be an overlap of a contact on a bottom layer of the interconnect layer which allows for changes in dimensions during heat cycles. For example, a contact on the substrate which may be a ceramic substrate may move in an x y dimension. The jog may be a short electrical redistribution contact which would take into consideration the ceramic shrinkage and distortion tolerances from processing to permit one or more design points of electrical connection accommodations such as from process, sintering or other heat/process changes that impact size and feature positional accuracy in X, Y and Z dimensions of the substrate. Each of the contacts of the substrate may be characterized as to movement after heat cycles and a corresponding jog for each corresponding contact on the bottom of the interconnect layer may be made.

The interconnect layer 16 may be the LDSL as described above. The interconnect layer 16 may include several layers of a first thin film with wiring. In an embodiment, each layer of the first thin film may include a dielectric of polyimide base between 5 and 8 microns and a copper thickness for line width and spacing of 20 microns, a bump pitch of 150 microns and there may be 8 to 10 first thin film layers in the build-up layer 16, or more. The interconnect layer 16 may provide circuitry connecting the chips on the package 10. The interconnect layer 16 may provide wiring, vias and circuity on each of the first thin film layers. The interconnect layer 16 may have contact pads on an upper surface which connect electrically and mechanically to inputs and outputs of the chips mounted on the package 10, including the hub controller integrated circuit 24, the long reach input/out integrated circuit 26, the wires 28 and any other electronic components on the package 10. In an embodiment, the interconnect layer 16 may provide circuitry for global input/output for the package 10. A lower surface of the interconnect layer 16 may have contact pads which align with the contact pads on an upper surface of the base substrate 12 which are connected to each other electrically and mechanically. There may be openings in the interconnect layer 16 corresponding to openings in the high-k substrate 14 and contact pads on an upper surface of the base substrate 12.

The thin film substrate 18 may be the HDSL as described above. The thin film substrate 18 may cover a portion of an upper surface of the interconnect layer 16. The thin film substrate 18 may include several layers of a second thin film with wiring. In an embodiment, each layer of the second thin film may include a dielectric of polyimide base between 5 and 8 microns and a copper thickness for line width and a spacing between 2 and 3 microns, a bump pitch of 55 microns on a top surface and 150 microns on a bottom surface. There may be four second thin film layers in the thin film substrate 18, or more. The thin film substrate 18 may provide circuitry connecting the chips on the thin-film substrate 18 to the package 10. The thin film substrate 18 may have contact pads on an upper surface which connect electrically and mechanically to inputs and outputs of the chips mounted on the thin film substrate 18, including the memory chip 22, the hub controller integrated circuit 24 any other electronic components on the thin film substrate 18. In an embodiment, the thin film substrate 18 may provide circuitry for local input/output for the package 10. A lower surface of the thin film substrate 18 may have contact pads which align with contact pads on an upper surface of the interconnect layer 16 which are connected to each other electrically and mechanically.

As shown in FIGS. 1 and 2, there are 2 thin film substrates 18 on the package 10. There may be any number of thin film substrates 18 on the package 10. As shown in FIGS. 1 and 2, each of the thin film substrates 18 have 4 chips mounted on the thin film substrate 18, however there may be any number of chips mounted on the thin film substrate 18.

Figure 3:
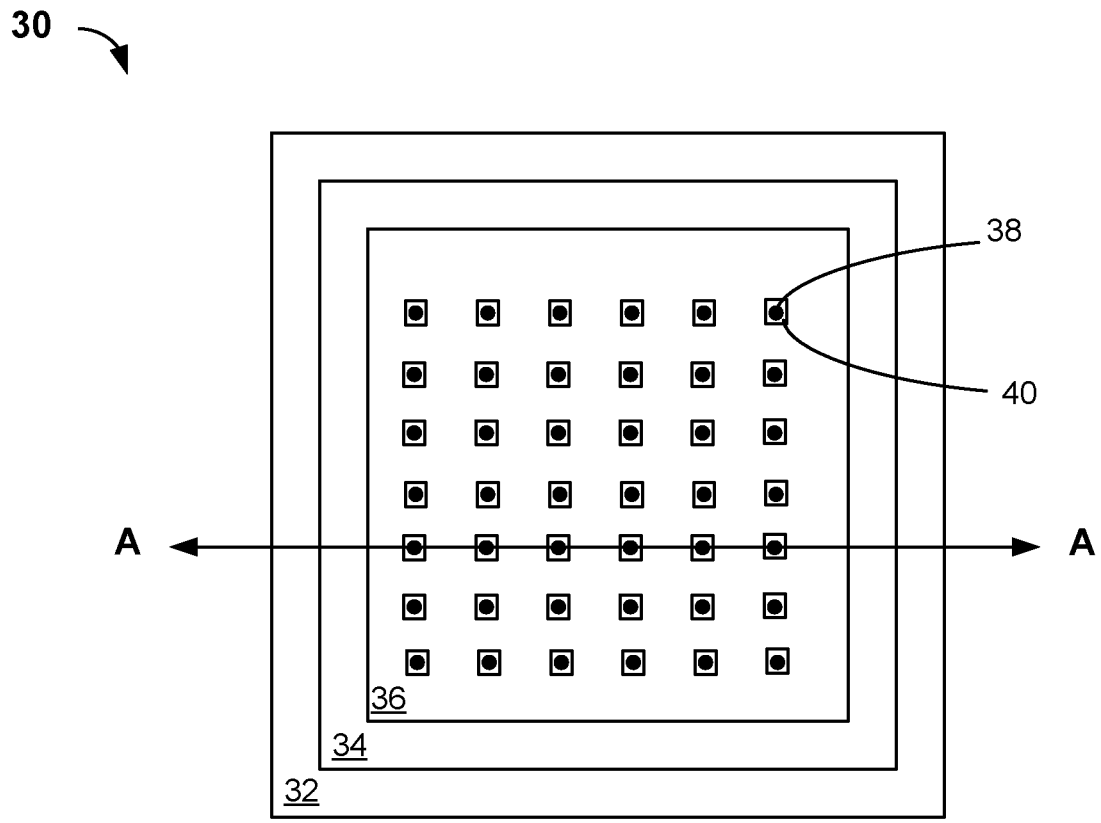
FIG. 3 is a top view of a thin film substrate on a substrate, according to an embodiment.
Figure 4:
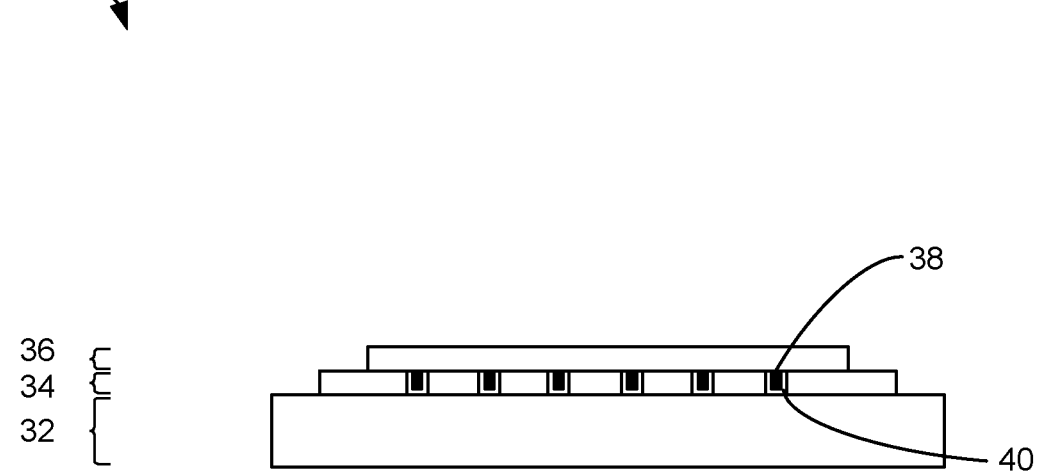
FIG. 4 is a cross section view of FIG. 3 taken along section line A-A, according to an embodiment.

Referring now to FIGS. 3 and 4, a package 30 of a thin film substrate on a substrate is shown, according to an exemplary embodiment. FIG. 3 is a top view of the package 30, while FIG. 4 is a side view of FIG. 3 along section line A-A. The package 30 includes a base substrate 32, an interconnect layer 34, a thin film substrate 36, metal posts 38 and solder 40.

The base substrate 32 may be as described above regarding the base substrate 12. The interconnect layer 34 may be attached to an upper surface of the substrate 32.

Openings in the interconnect layer 34 may have metal posts 38 and solder 40 which electrically and mechanically connect contacts and vias on the upper surface of the substrate 32 to a lower surface of the thin film substrate 36.

As shown in FIGS. 3 and 4, there are 36 metal posts 38 in the interconnect layer 34, however there may be any number of metal posts 38 in the interconnect layer 34. The dielectric material may be polyimide (PI) or may be photo sensitive polyimide (PSPI) or an alternate dielectric material. A non conductive film (NCF), an adhesive layer, molding compound or capillary underfill fill (CUF) materials may be used for integration. The interconnect layer 34 may be planarized, for example with chemical mechanical polishing (CMP) technique, milling, grind, laser, or other means to achieve a fin pitch interconnect between the substrate 32 and the interconnect layer 34, and between the interconnect layer 34 and the thin film substrate 36.

The openings may have a diameter between 50 and 100 microns, a height between 1 and 120 microns, a pitch between openings of 150 to 250 microns, and each filled with the metal posts 38 and solder 40. The metal posts may be 1 to 75 microns.

The vias of the interconnect layer 34 may be formed of a shape which is wider than contacts of the upper surface of the substrate 32 to allow for different CTE and possible shrinkage of the substrate 32 and still allow electrical connection between the vias of the interconnect layer 34 and the substrate 32.

The thin film substrate 36 may be as described above regarding the thin film substrate 18.

Figure 5:
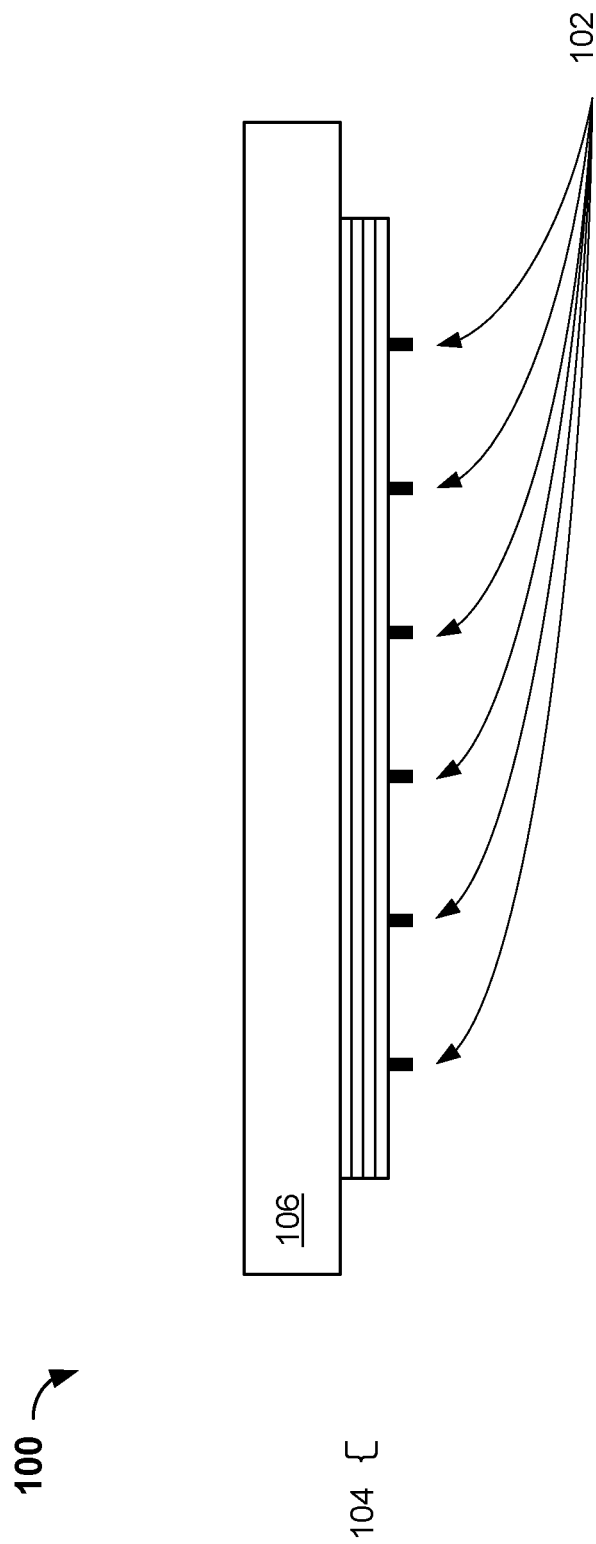
FIG. 5 is a side view of a thin film substrate attached to a handler, according to an embodiment.

Referring now to FIG. 5, a side view of a first structure 100 is shown, according to an exemplary embodiment. The first structure 100 includes metal posts 102, a thin film substrate 104 and a handler 106.

The thin film substrate 104 may be as described above regarding the thin film substrate 18. The metal posts 102 may be connected to a lower surface of the thin film substrate. Each of the metal posts 102 may each be connected to a via or contact pad on a lower surface of the thin film substrate 104. There may be any number of metal posts 102 on the handler, for example 144 posts on a 100 millimeter square thin film substrate 104.

Subsequently, an upper surface of the thin film substrate 104 may be attached to the handler 106. The handler 106 may provide a stable surface for the thin film substrate 104. The handler 106 may be glass, silicon or other material. The thin film substrate 104 may be attached to the handler 106 by transfer and bonding from a handle wafer or panel using a mechanical or laser release layer and adhesive prior to or subsequent to bonding.

Figure 6:
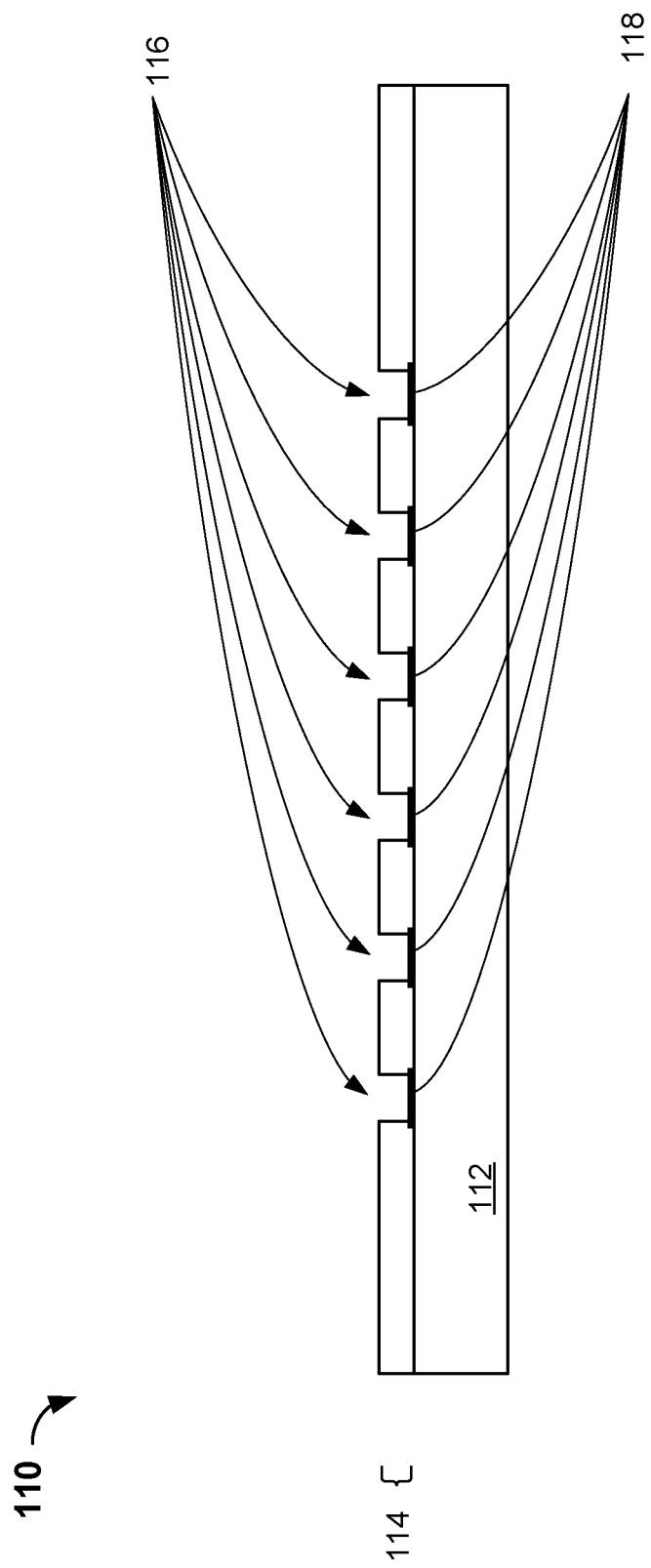
FIG. 6 is a side view of a substrate and interconnect layers, according to an embodiment.

Referring now to FIG. 6, a side view of a second structure 110 of a substrate and interconnect layers is shown, according to an exemplary embodiment. The second structure 110 includes an interconnect layer 114, a base substrate 112 with external pads 118.

The interconnect layer 114 may be as described for the interconnect layer 16 above. There may be cavities 116 in the interconnect layer 114.

The interconnect layer 114 may be attached onto an upper surface of the base substrate 112. Each of the cavities 116 in the interconnect layer 114 may align with an external pad 118 on an upper surface of the base substrate 112. The base substrate 112 may be as described above regarding the base substrate 12. The external pads 118 may each provide a contact for circuitry within the base substrate 112. The interconnect layer 114 may be attached by use of heat for solder reflow for electrical connections and by means of dielectric adhesive, heat and pressure for dielectric bonding.

Figure 7:
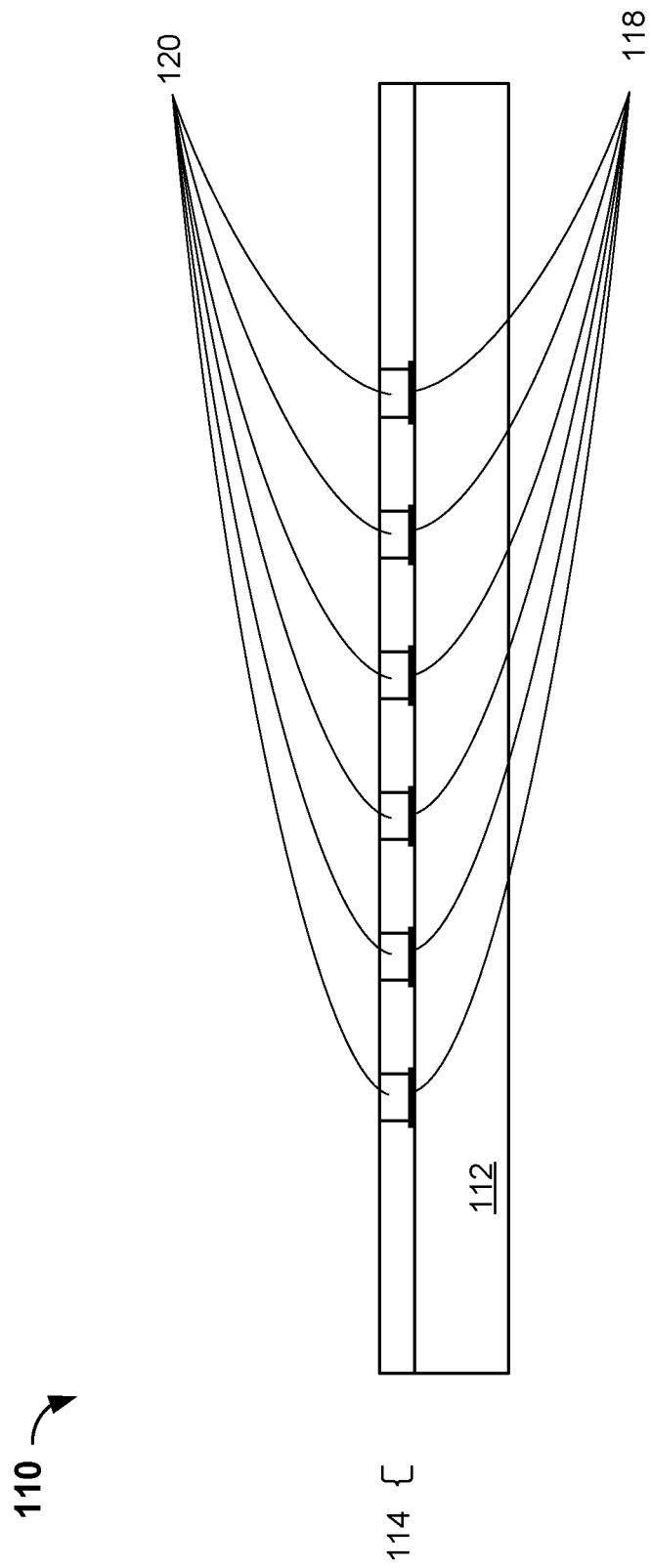
FIG. 7 is a side view of the substrate and the interconnect layers, according to an embodiment.

Referring now to FIG. 7, a side view of the second structure 110 is shown, according to an exemplary embodiment. Solder paste 120 may be applied in each of the cavities 116 of the interconnect layer 114 of the second structure 110.

Figure 8:
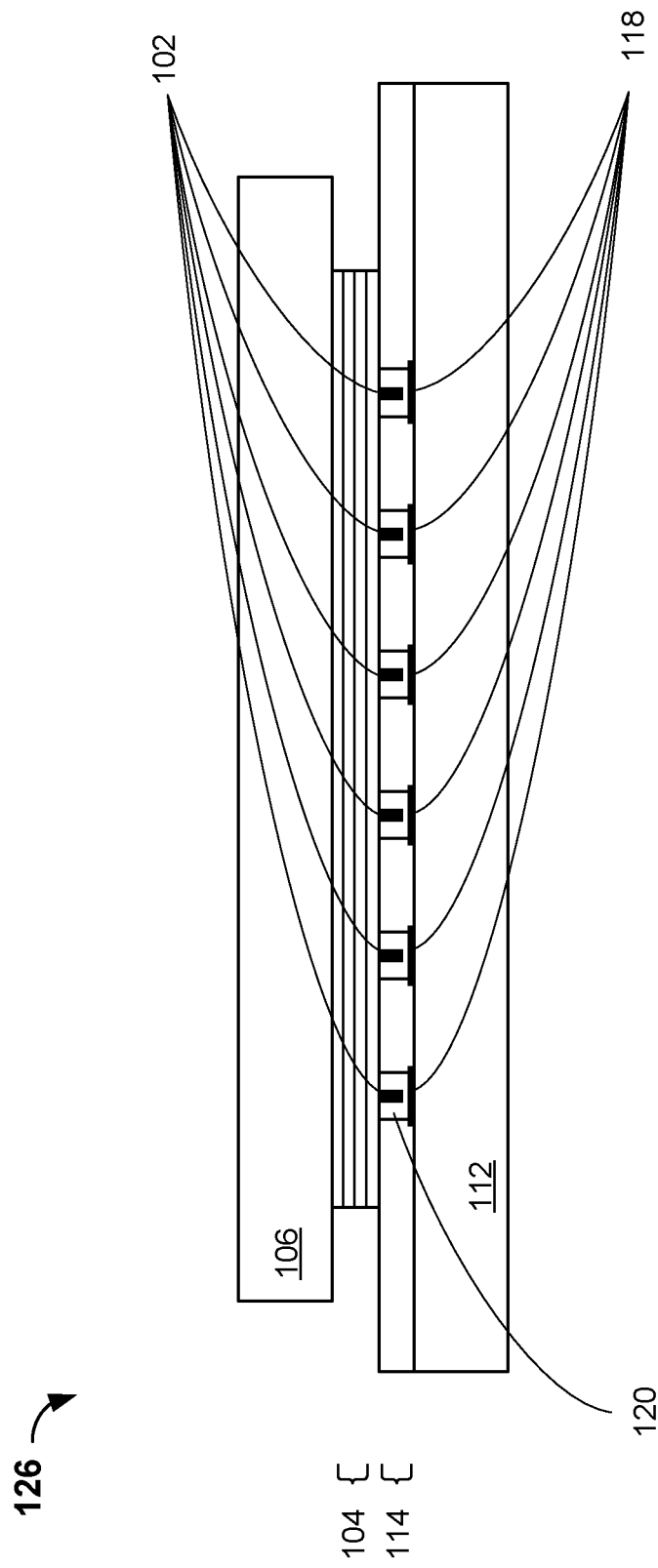
FIG. 8 is a side view of the thin film substrate and the substrate, according to an embodiment.

Referring now to FIG. 8, a side view of the first structure 100 mounted on the second structure 110 is shown, resulting in a combined structure 126, according to an exemplary embodiment.

The metal posts 102 of the first structure 100 may be aligned with the solder paste 120 filled cavities 116 of the interconnect layer 114. There may be a same number of metal posts 102 as solder paste 120 filled cavities 116. The first structure 100 and the second structure 110 may be heated and pressed together at a temperature above a solder melting point of the solder paste 120. The amount of solder paste 120 and the volume of the metal post 102 in each of the cavities 116 should fill each cavity 116 without metal overflow and provide an electrical and mechanical connection between each external pad 118 of the base substrate 112 and each corresponding contact or via of the lower surface of the thin film substrate 104.

Figure 9:
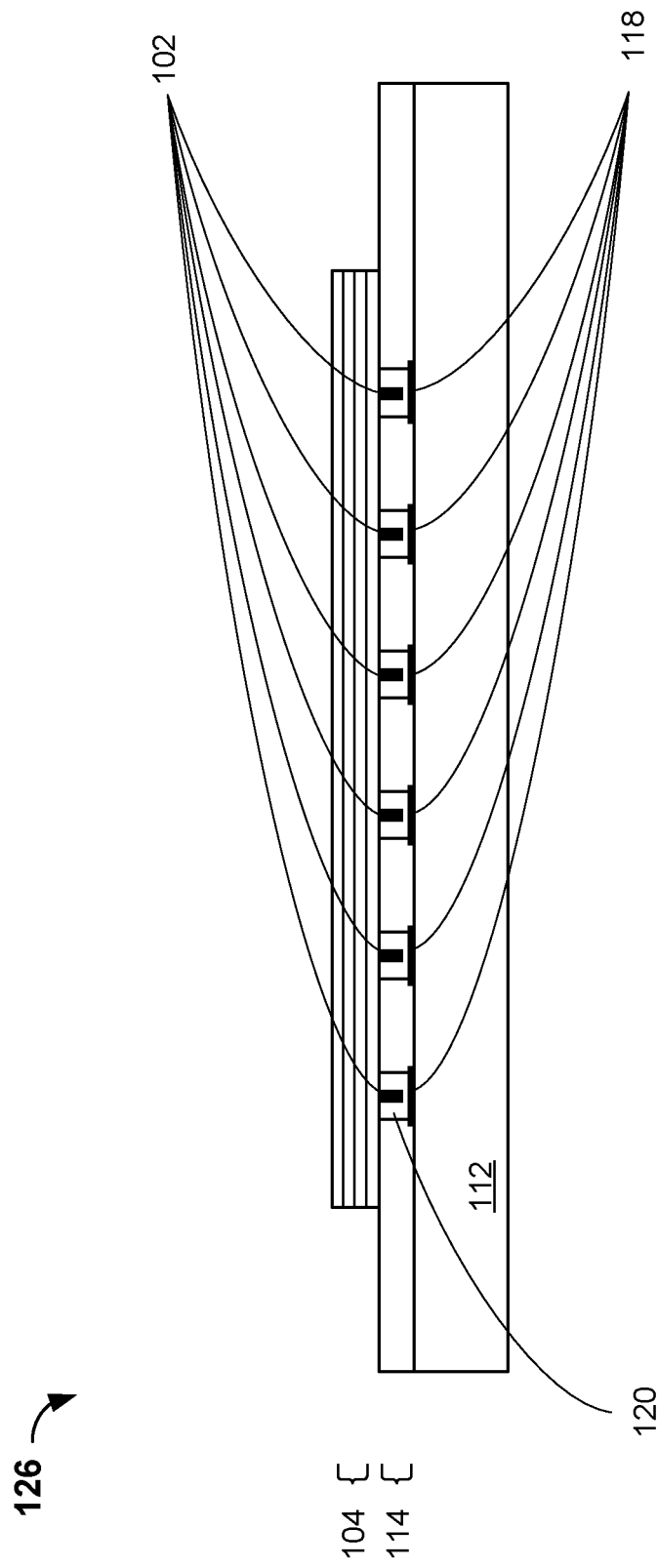
FIG. 9 is a side view of the thin film substrate and the substrate, according to an embodiment.

Referring now to FIG. 9, a side view of the combined structure 126 is shown, according to an exemplary embodiment.

As described regarding FIG. 8, once the first structure 100 is mounted on the second structure 110, the combined structure 126 should be held in position during a cooling stage until both adhesive resin used for the connection has cured or achieve high viscosity and the solder or solder paste 120 has created an electrical connection, pad and solidified. The adhesive resin can be a polyimide based adhesive or alternate dielectric material.

Subsequently, the handler 106 may be removed. The combined structure 126 has the thin film substrate 104 with layers of vias and lines mounted on the interconnect layer 114 with layers of vias and lines. There are resulting aligned connections between the lower surface of the thin film substrate 104 and the external pads 118 on the upper surface of the base substrate 112 by each of the metal posts 102 embedded in the reflowed solder paste 120.

Figure 10:
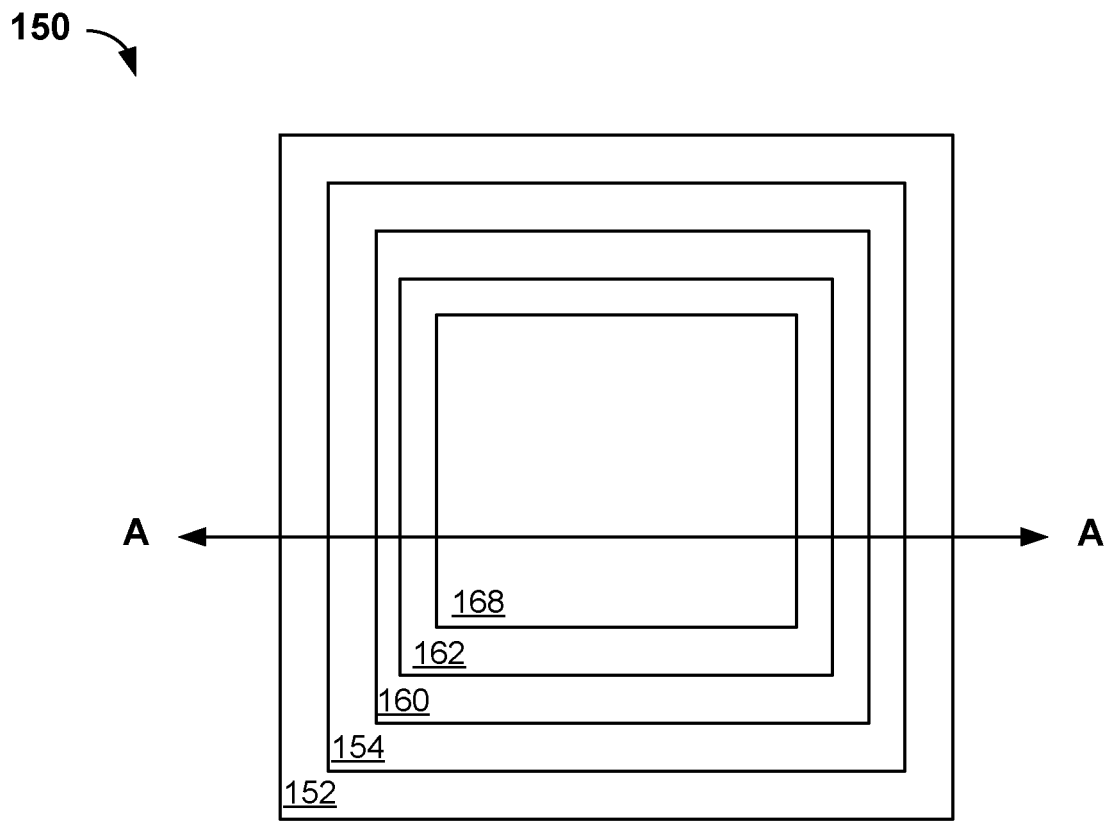
FIG. 10 is a top view of a thin film substrate and a high-k substrate (or integrated decoupling capacitors (or discrete capacitors) and/or inductors layer (or discrete inductors)) attached to a substrate, according to an embodiment.
Figure 11:
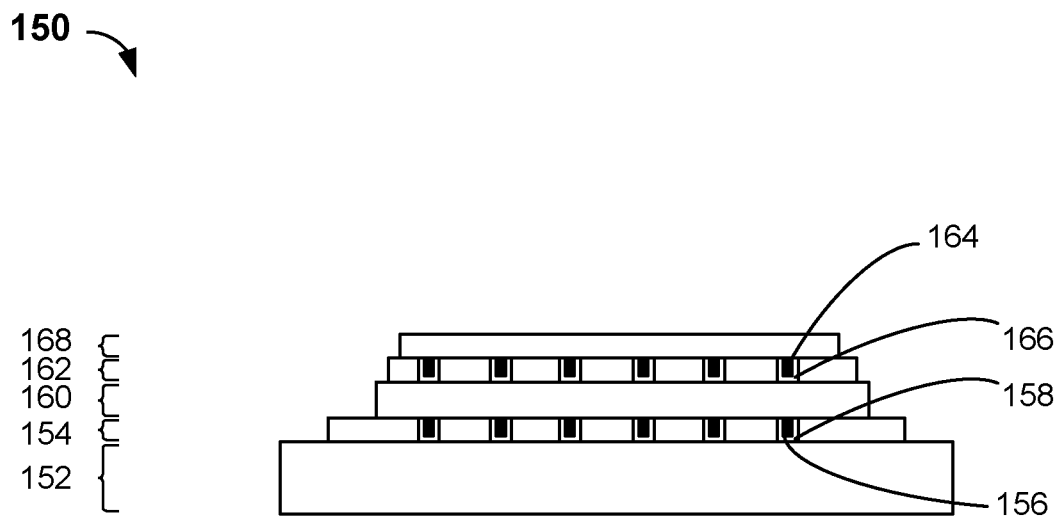
FIG. 11 is a cross section view of FIG. 10, taken along section line A-A, according to an embodiment.

Referring now to FIGS. 10 and 11, a package 150 is shown, according to an exemplary embodiment. FIG. 10 is a top view of the package 150, while FIG. 11 is a side view of FIG. 10 along section line A-A. The package 150 includes a base substrate 152, an interconnect layer 154, a high-k substrate 160, an interconnect layer 162 and a thin film substrate 168.

The base substrate 152 may be as described above regarding the base substrate 12. The interconnect layer 154 may be attached to an upper surface of the base substrate 152 and may be as described above regarding the interconnect layer 16.

Openings in the interconnect layer 154 may have metal posts 156 and solder paste 158 which electrically and mechanically connect contacts and vias on an upper surface of the base substrate 152 to a lower surface of the high-k substrate 160. The metal posts 156 and solder paste 158 may be formed as described above regarding the metal posts 102 and the solder paste 120 as described above.

The high-k substrate 160 may be as described above regarding the high-k substrate 14. The high-k substrate 160 may be attached to the interconnect layer 154 by dielectric adhesive bonding and electrical pad solder bonding. The high-k substrate 160 may have metal contacts on a lower surface which electrically and mechanically connect contacts and vias on an upper surface of the interconnect layer 154 to contacts and vias on a lower surface of interconnect layer 162.

The interconnect layer 162 may be formed as described above regarding the interconnect layer 16 as described above. Openings in the interconnect layer 162 may have metal posts 164 and solder paste 166 which electrically and mechanically connect contacts and vias on an upper surface of the high-k substrate 160 to a lower surface of the thin film substrate 168. The metal posts 164 and solder paste 166 may be formed as described above regarding the metal posts 102 and the solder paste 120 as described above.

The thin film substrate 168 may be formed as described above regarding the thin film substrate 18. The thin film substrate may be on an upper surface of the interconnect layer 162

As shown in FIG. 11, there are 6 metal posts 156 in the interconnect layer 154, however there may be any number of metal posts 156 in the interconnect layer 154.

Figure 12:
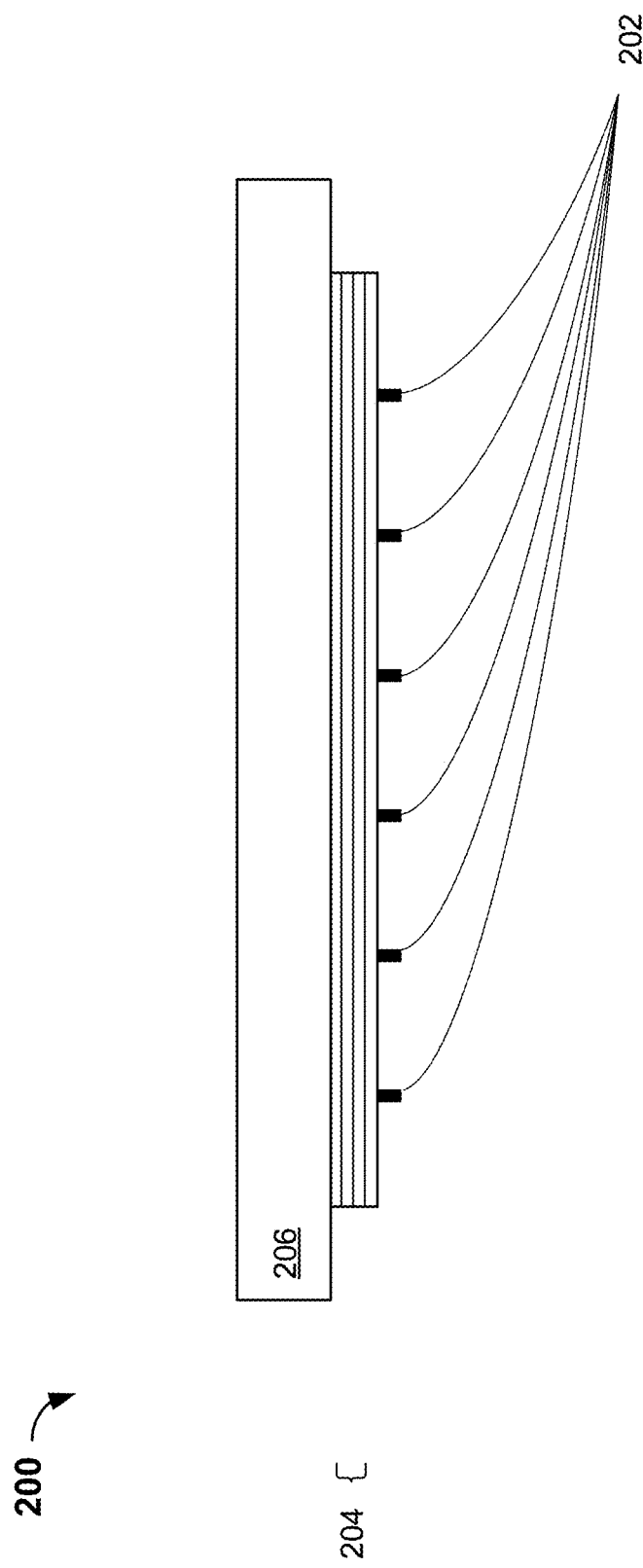
FIG. 12 is a side view of a high-k substrate attached to a handler, according to an embodiment.

Referring now to FIG. 12, a side view of a third structure 200 is shown, according to an exemplary embodiment. The third structure 200 includes metal posts 202, a thin film substrate 204 and a handler 206.

The third structure 200 may be as described above regarding the first structure 100, the metal posts 102, the thin film substrate 104 and the handler 106.

Figure 13:
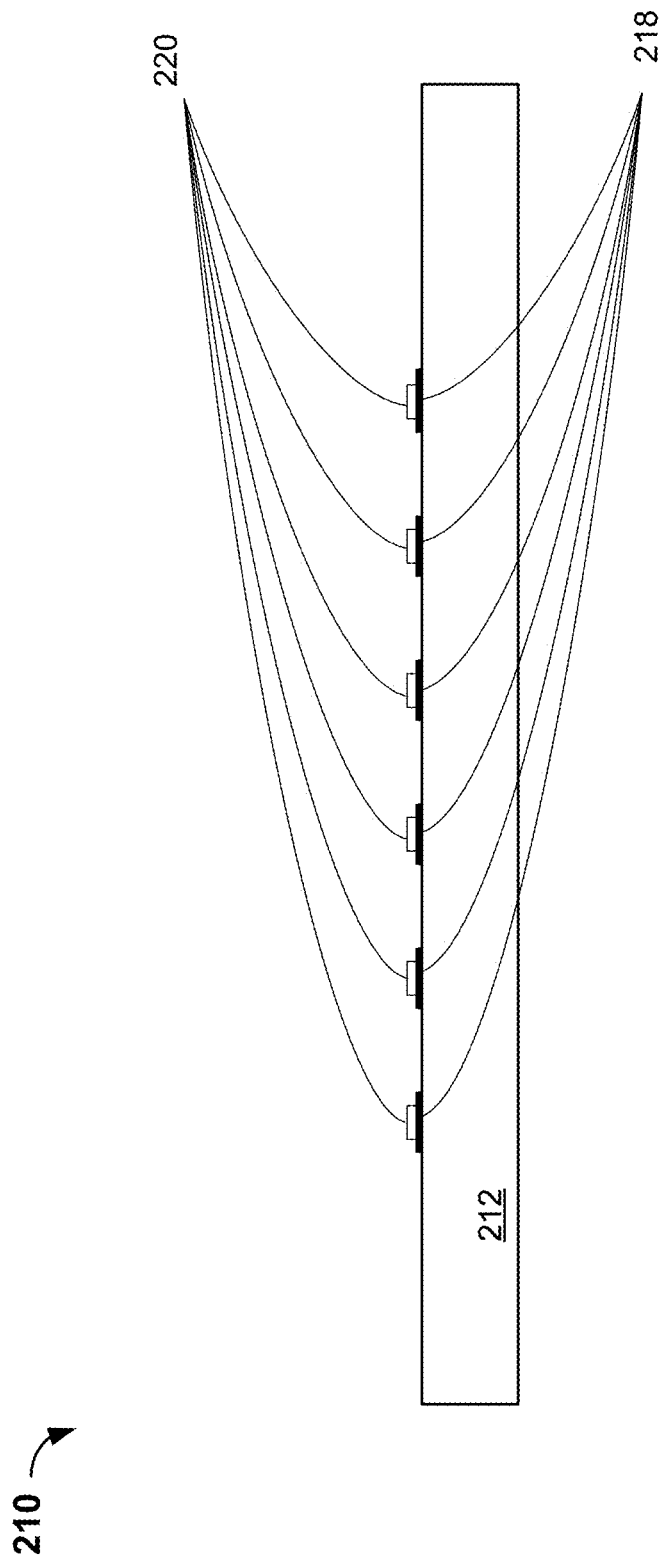
FIG. 13 is a side view of a substrate, according to an embodiment.

Referring now to FIG. 13, a side view of a fourth structure 210 is shown, according to an exemplary embodiment. The fourth structure 210 includes a base substrate 212 with external pads 218.

The fourth structure 210 may be as similar as described above regarding the second structure 110 with the base substrate 212 as described regarding the base substrate 12 and external pads 218 as described regarding the external pads 118.

Solder studs 220 may be formed on the external pads 218 as shown in FIG. 13. The solder studs 220 may be an alternate to the solder paste 120 used above. The solder studs 220 may hold their shape during subsequent manufacturing steps.

Figure 14:
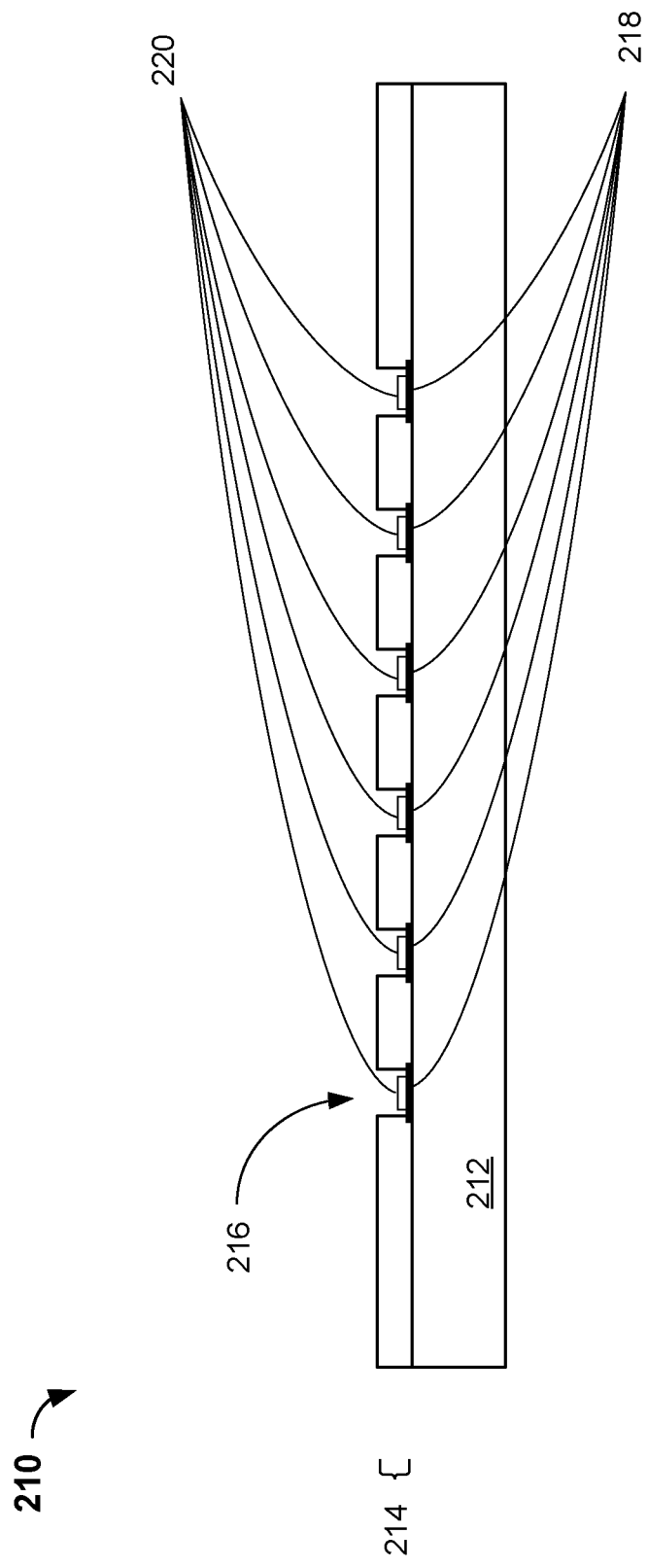
FIG. 14 is a side view of the substrate and an interconnect layer, according to an embodiment.

Referring now to FIG. 14, a side view of the fourth structure 210 is shown, according to an exemplary embodiment. An interconnect layer 214 may be formed on the base substrate 212.

The interconnect layer 214 may be formed as described for the interconnect layer 114 above. The interconnect layer 214 may have cavities 216. Each of the cavities 216 may align with a solder stud 220 and an external pad 218.

In this embodiment, the solder studs 220 may be formed on the external pads 218 and then the interconnect layer 214 formed. In contrast, in the embodiment of FIGS. 5-9, the interconnect layer 114 may be attached to the base substrate 112 and then the solder paste 120 formed in the cavities 116 of the interconnect layer 114. As shown in FIG. 14, there are 6 solder studs 220, however there may be any number of solder studs 220.

Figure 15:
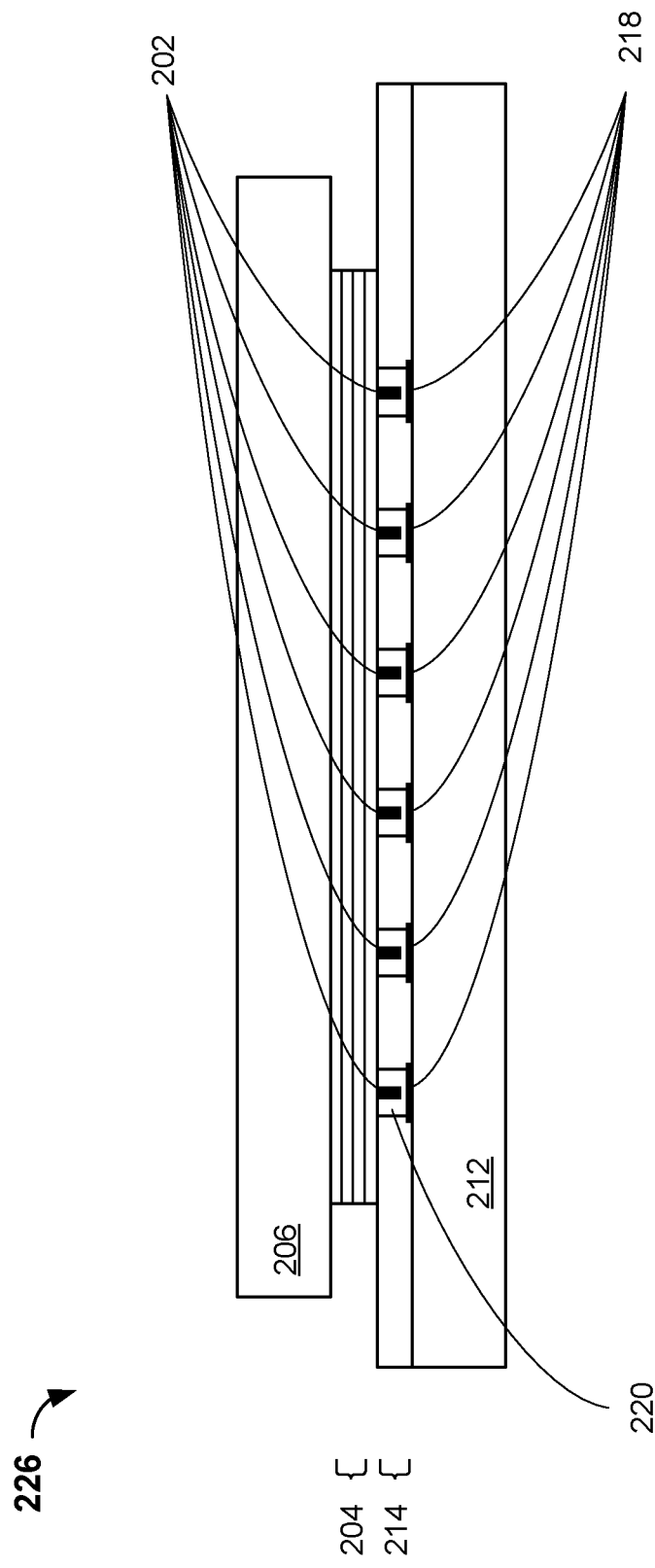
FIG. 15 is a side view of the thin film substrate attached to the substrate, according to an embodiment.

Referring now to FIG. 15, a side view of the third structure 200 mounted on the fourth structure 210 is shown, resulting in a combined structure 226, according to an exemplary embodiment.

The metal posts 202 of the third structure 200 may be aligned with the solder studs 220 and the cavities 216 of the interconnect layer 214. There may be a same number of metal posts 202 as solder studs 220 and cavities 216. The third structure 200 and the fourth structure 210 may be heated and pressed together at a temperature above a solder melting point of the solder studs 220. The amount of solder in each of the solder studs 220 and the volume of the metal post 202 in each of the cavities 216 should fill each cavity 216 without metal overflow and provide an electrical and mechanical connection between each external pad 218 of the base substrate 212 and each corresponding contact or via of the lower surface of the thin film substrate 204.

Figure 16:
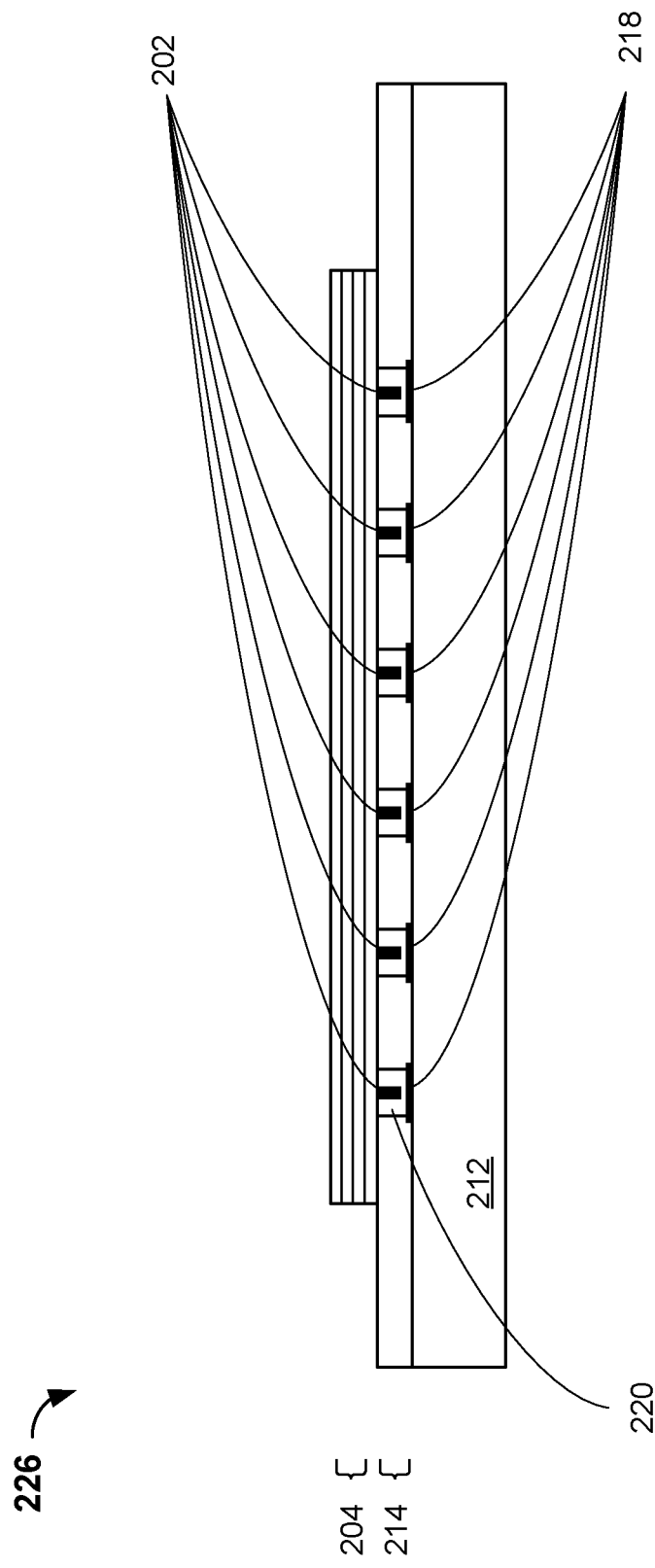
FIG. 16 is a side view of the thin film substrate attached to the substrate, according to an embodiment.

Referring now to FIG. 16, a side view of the combined structure 226 is shown, according to an exemplary embodiment.

As described regarding FIG. 15, once the third structure 200 is mounted on the fourth structure 210, the combined structure 226 should be held in position during a cooling stage until both resin and the solder of the solder studs 220 have settled.

Subsequently, the handler 206 may be removed. The combined structure 226 has the thin film substrate 204 with layers of vias and lines mounted on the interconnect layer 214 with layers of vias and lines. There are resulting aligned connections between the lower surface of the thin film substrate 204 and the external pads 218 on the upper surface of the base substrate 212 by each of the metal posts 202 embedded in the reflowed solder studs 220.

Figure 17:
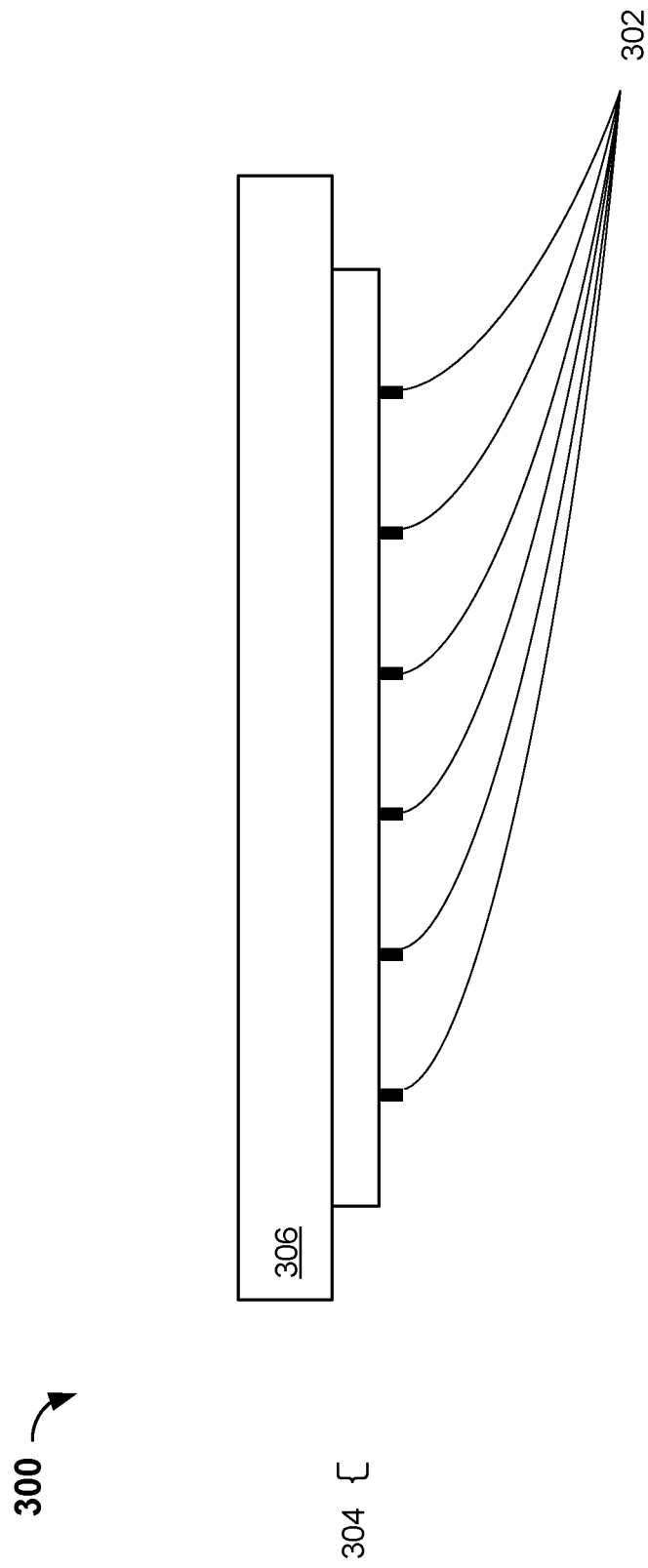
FIG. 17 is a side view of a high-k substrate attached to a handler, according to an embodiment.

Referring now to FIG. 17, a side view of a fifth structure 300 of a thin film substrate attached to a handler is shown, according to an exemplary embodiment. The fifth structure 300 includes metal posts 302, a high-k substrate 304 and a handler 306.

The fifth structure 300 may be as described above regarding the first structure 100, the metal posts 302 and the handler 306.

In this embodiment, the high-k substrate 304 is used instead of the thin film substrate 104 in the first embodiment of FIGS. 5-9 or the thin film substrate 204 in the second embodiment of FIG. 12-16.

The high-k substrate 304 may be as described above regarding the high-k substrate of FIGS. 1 and 2.

Figure 18:
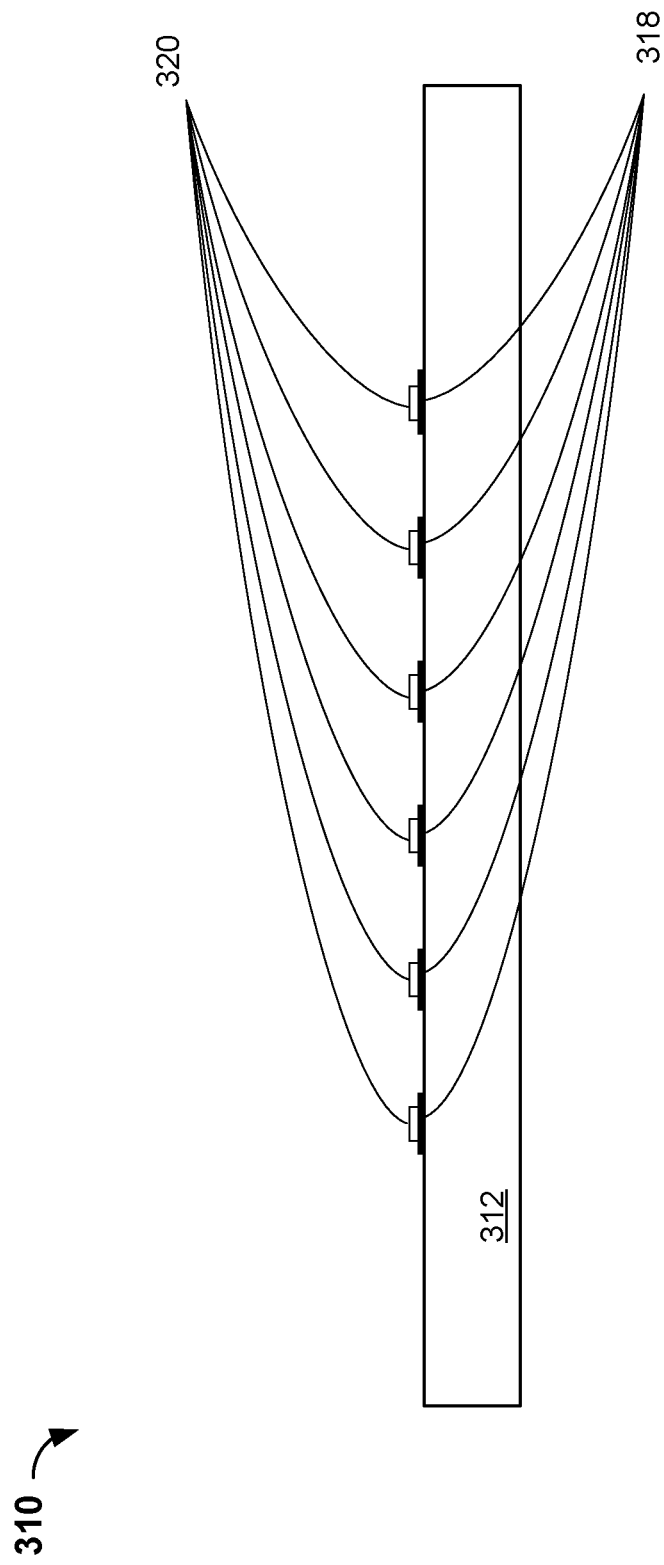
FIG. 18 is a side view of a substrate, according to an embodiment.

Referring now to FIG. 18, a side view of a sixth structure 310 is shown, according to an exemplary embodiment. The sixth structure 310 includes a base substrate 312 with external pads 318.

The sixth structure 310 may be as similar as described above regarding the second structure 110 with the base substrate 312 as described regarding the base substrate 12 and external pads 318 as described regarding the external pads 118.

Solder studs 320 may be formed on the external pads 318 as shown in FIG. 18. The solder studs 320 may be as described above regarding the solder studs 220.

Figure 19:
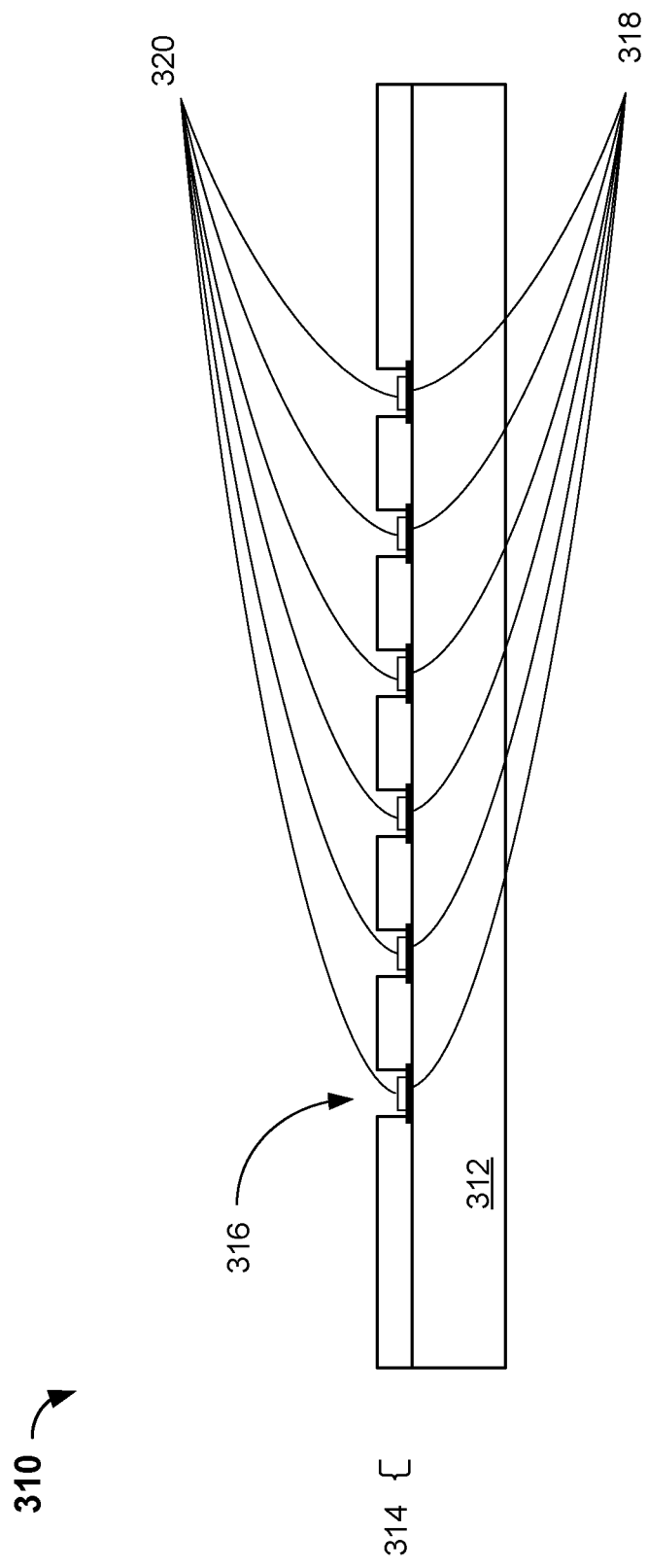
FIG. 19 is a side view of the substrate, according to an embodiment.

Referring now to FIG. 19, a side view of the sixth structure 310 is shown, according to an exemplary embodiment. An interconnect layer 314 may be formed on the base substrate 312.

The interconnect layer 314 may be formed as described for the interconnect layer 114 above. The interconnect layer 314 may have cavities 316. Each of the cavities 316 may align with a solder stud 320 and an external pad 318.

In this embodiment, the solder studs 320 may be formed on the external pads 318 and then the interconnect layer 314 formed. In contrast, in the embodiment of FIGS. 5-9, the interconnect layer 114 may be attached to the base substrate 112 and then the solder paste 120 formed in the cavities 116 of the interconnect layer 114.

As shown in FIG. 19, there are 6 solder studs 320, however there may be any number of solder studs 220, each corresponding to an external pad 318 of the base substrate 312.

Figure 20:
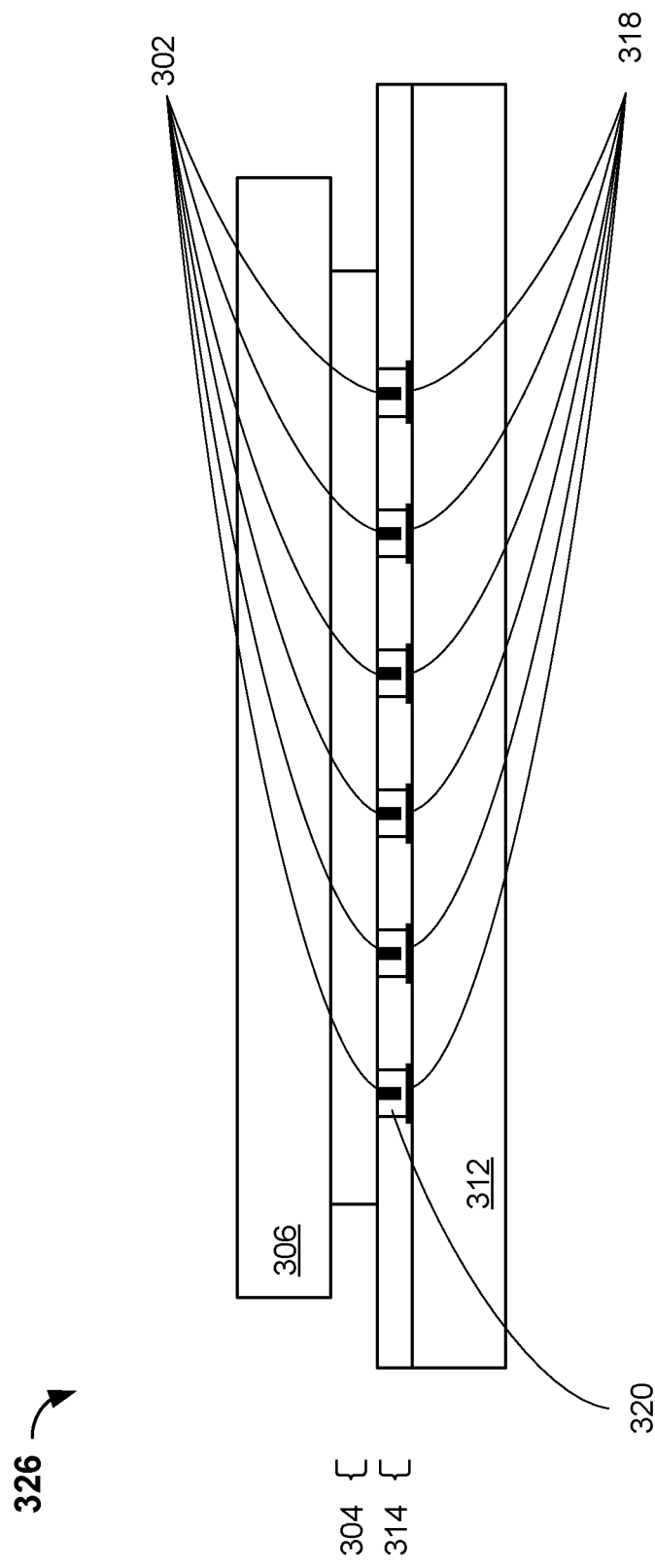
FIG. 20 is a side view of the high-k substrate attached to the substrate, according to an embodiment.

Referring now to FIG. 20, a side view of the fifth structure 300 mounted on the sixth structure 310 is shown, resulting in a combined structure 326, according to an exemplary embodiment.

The metal posts 302 of the fifth structure 300 may be aligned with the solder studs 320 and the cavities 316 of the interconnect layer 314. There may be a same number of metal posts 302 as solder studs 320 and cavities 316. The fifth structure 300 and the sixth structure 310 may be heated and pressed together at a temperature above a solder melting point of the solder studs 320. The amount of solder in each of the solder studs 320 and the volume of the metal post 302 in each of the cavities 316 should fill each cavity 316 without metal overflow and provide an electrical and mechanical connection between each external pad 318 of the base substrate 312 and each corresponding contact or via of the lower surface of the high-k substrate 304.

Figure 21:
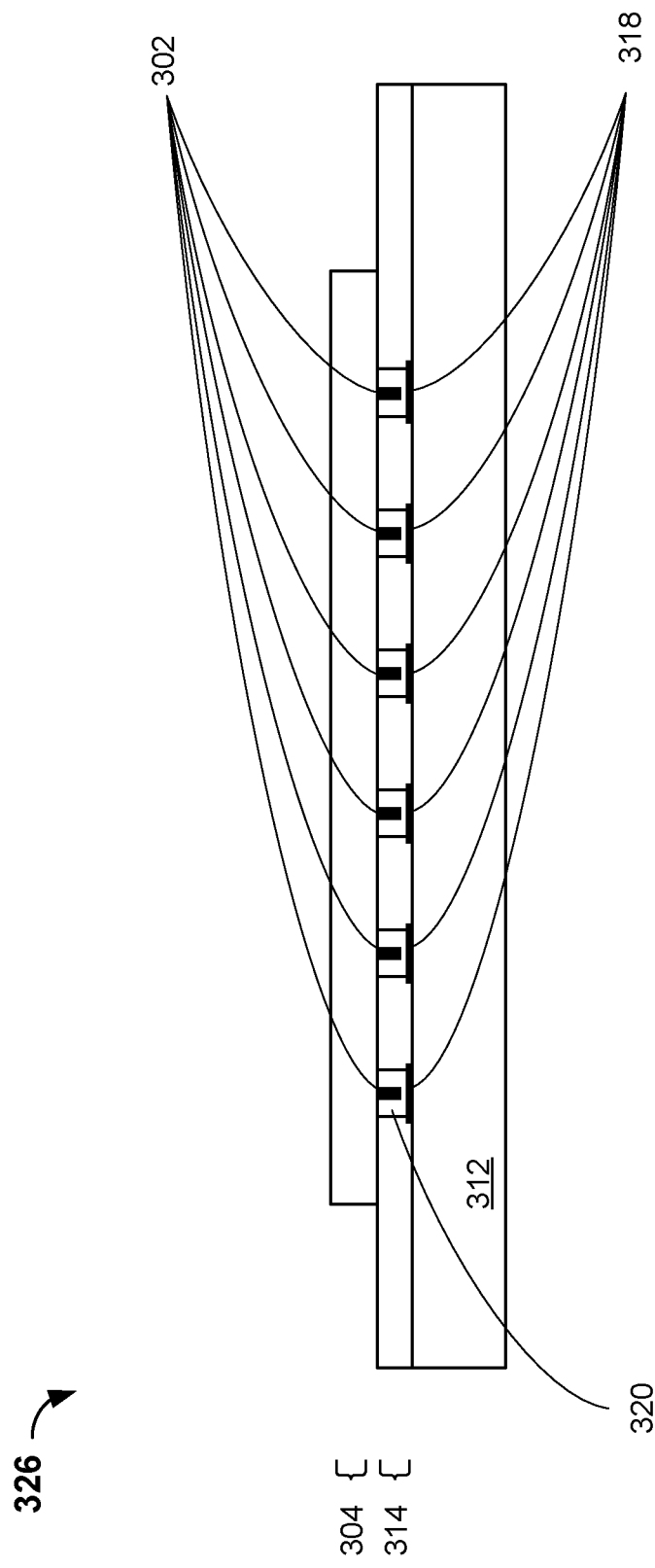
FIG. 21 is a side view of the high-k substrate attached to the substrate, according to an embodiment.

Referring now to FIG. 21, a side view of the combined structure 326 is shown, according to an exemplary embodiment.

As described regarding FIG. 20, once the fifth structure 300 is mounted on the sixth structure 310, the combined structure 326 should be held in position during a cooling stage until both resin and the solder of the solder studs 320 have settled.

Subsequently, the handler 306 may be removed. The combined structure 326 has the high-k substrate 304 with layers of vias and lines mounted on the interconnect layer 314 with layers of vias and lines. There are resulting aligned connections between the lower surface of the high-k substrate 304 and the external pads on the upper surface of the substrate 312 by each of the metal posts 302 embedded in the reflowed solder studs 320.

The combined structure 326 may be formed using solder paste rather than the solder studs 320 and the solder studs 330, in an embodiment.

The combined structure 326 may be comparable to the combined structure 226, however the high-k substrate 304 may be used rather than the thin film substrate 204. The high-k substrate 304 may be used when additional layers of substrate may be added to the structure, as described below in the description of FIGS. 22 and 23.

In some applications, a high k layer or layers or substrate may be used with discrete decoupling capacitors integrated in, on or embedded into the high-K layer or layers or substrate. The discrete decoupling capacitors may be used to support power delivery and voltage regulation to support improved chip performance. The high k substrate 304 may be added to support chip function with or without need of added high density wiring layers used for low loss, high bandwidth interconnection wiring layers 204, 104 between chips or chiplets.

Figure 22:
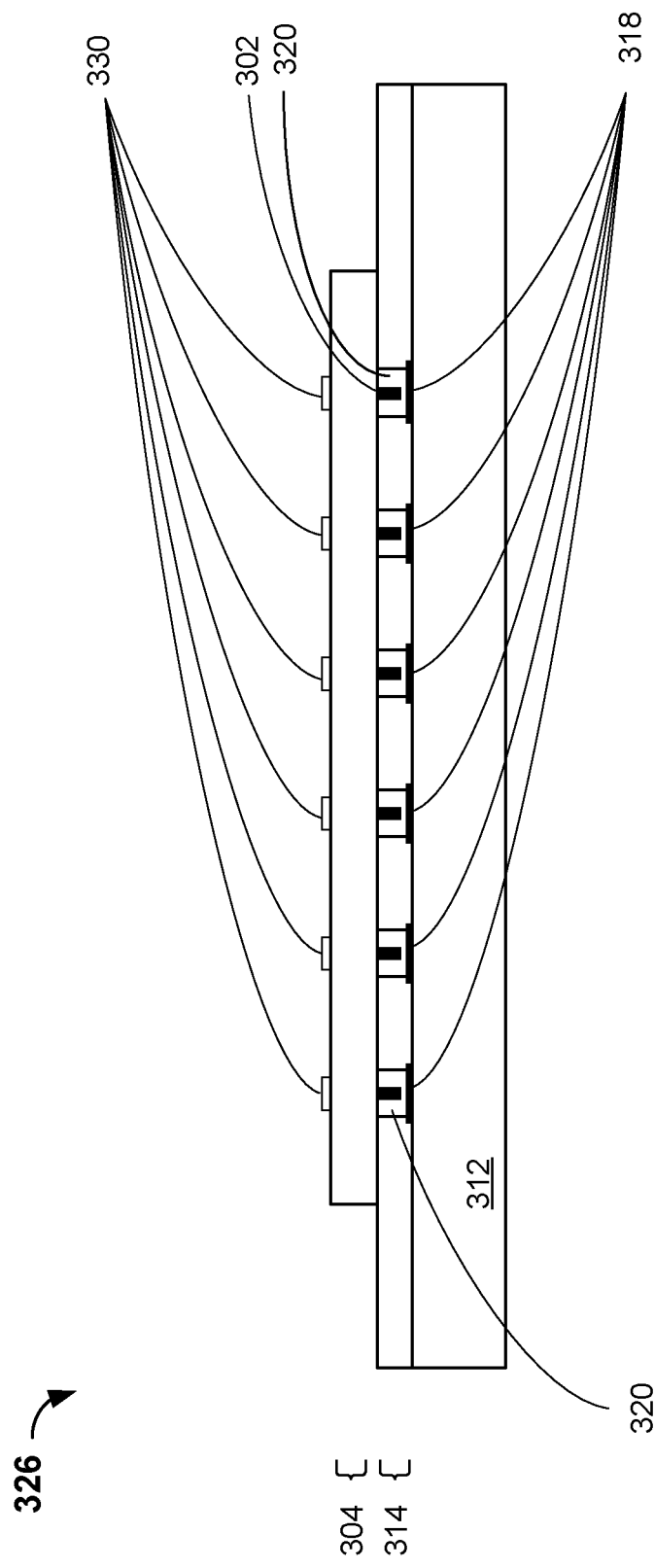
FIG. 22 is a side view of the high-k substrate attached to the substrate, according to an embodiment.

Referring now to FIG. 22, a side view of the combined structure 226 is shown, according to an exemplary embodiment.

Solder studs 330 may be formed on an upper surface of the high-k substrate 304. The solder studs 330 may be formed where contacts and vias are on the upper surface of the high-k substrate 304. The solder studs 320 may be as described above regarding the solder studs 220.

Figure 23:
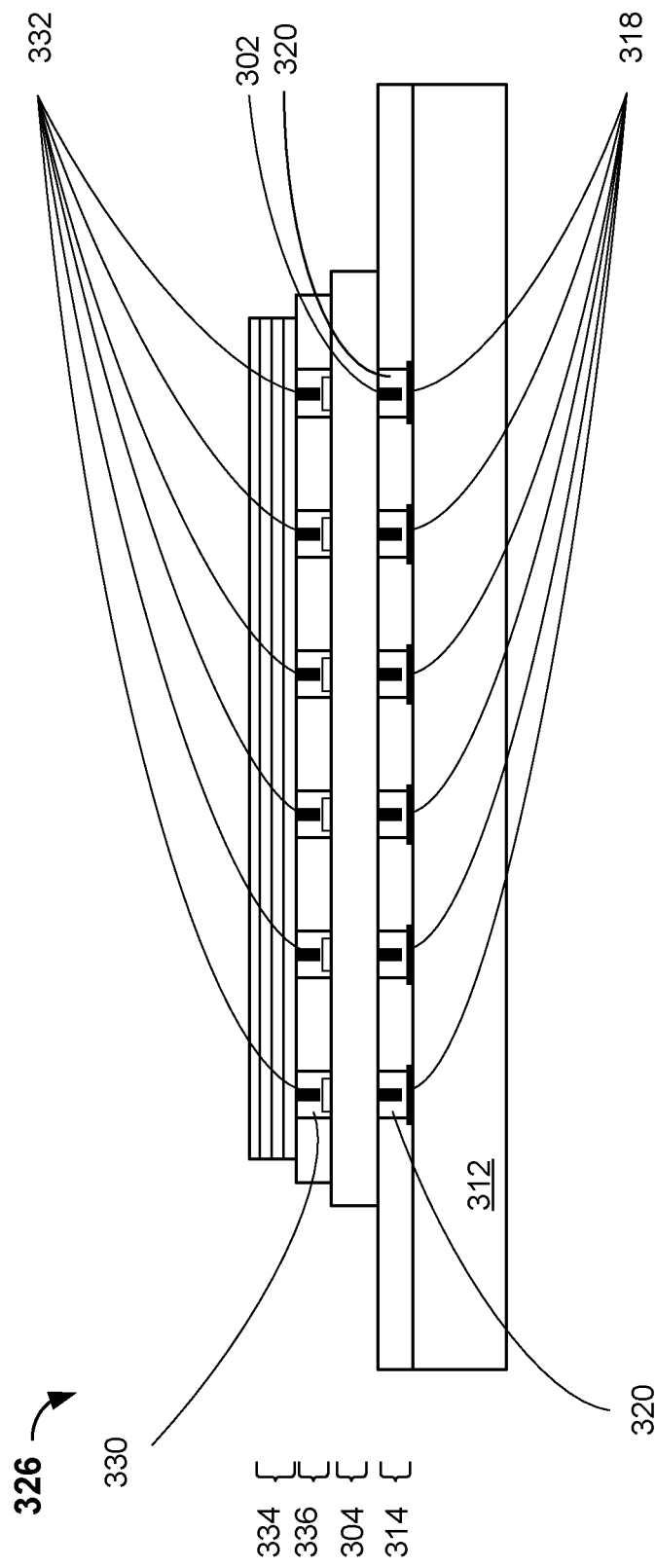
FIG. 23 is a side view of a thin film substrate attached to the high-k substrate and the substrate, according to an embodiment.

Referring now to FIG. 23, a side view of the combined structure 226 is shown, according to an exemplary embodiment.

A thin film substrate 334 may be formed on a handler (not shown). The thin film substrate 334 may be formed as described for the thin film substrate 18 above. Metal posts 332 may be attached to a lower surface of the thin film substrate 334, formed as described for the metal posts 156 above. The metal posts 332 may each be attached at a position of a via or contact of the lower surface of the thin film substrate 334.

The thin film substrate 334 with the metal posts 333 on the handler (not shown) may be mounted on the combined structure 326. The combined structure 326 should be held in position during a cooling stage until both resin and the solder of the solder studs 330 have settled. The handler (not shown) may then be removed.

The combined structure 326 has the high-k substrate 304 with layers of vias and lines mounted on the interconnect layer 314 with layers of vias and lines. There are resulting aligned connections between the lower surface of the high-k substrate 304 and the external pads 318 on the upper surface of the base substrate 312 by each of the metal posts 302 embedded in the reflowed solder studs 320. The combined structure 326 has the thin film substrate 334 with layers of vias and lines mounted on the interconnect layer 336 with layers of vias and lines. There are resulting aligned connections between the lower surface of the thin film substrate 334 and externals pads 318 on the upper surface of the high-k substrate 304 by each of the metal posts 332 embedded in the reflowed solder studs 330.

The combined structure has additional layers of wiring which may be required for larger combinations of substrates with increasing numbers of electrical components mounted on the base substrate 312.

Figure 24:
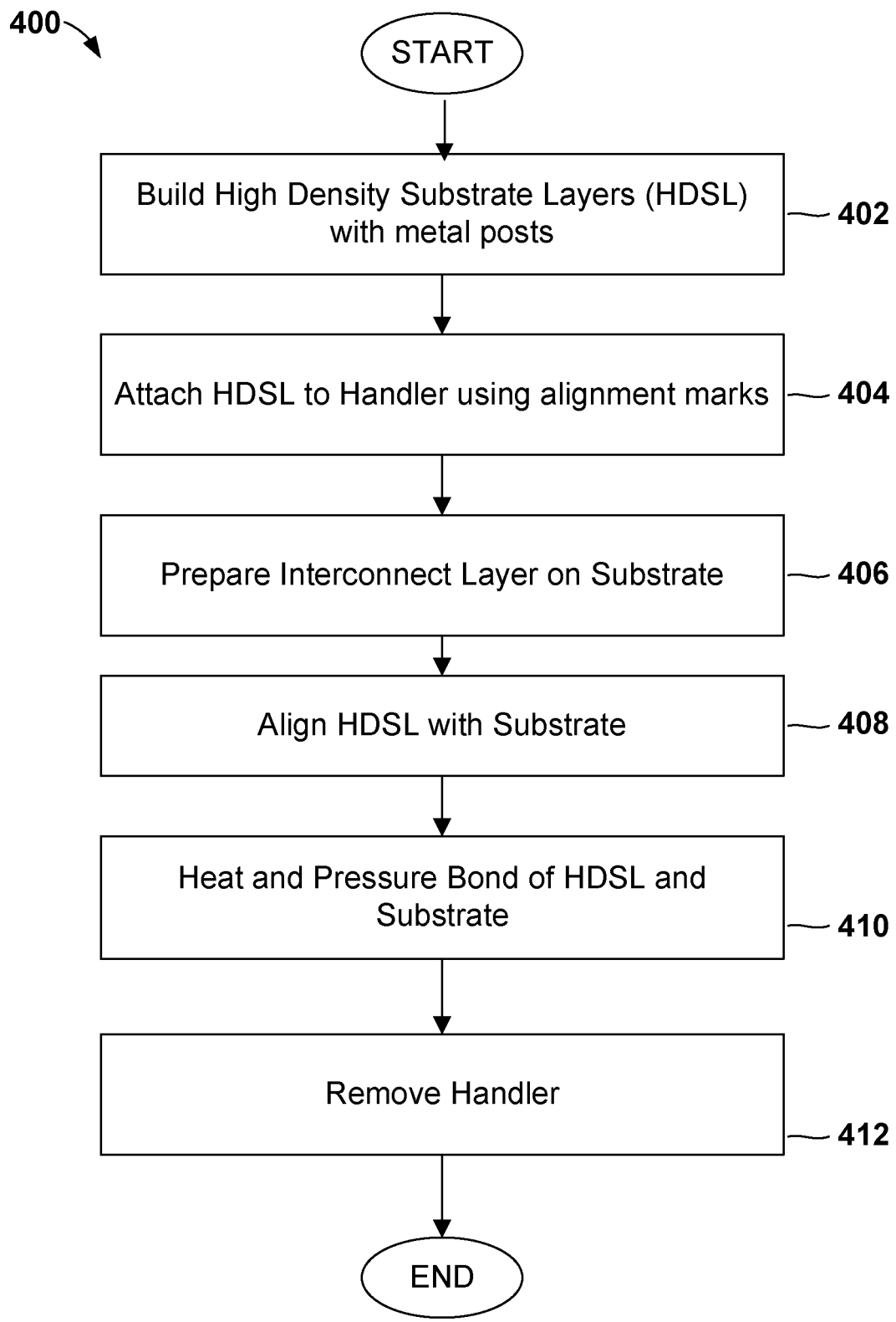
FIG. 24 is a flow chart of a method to stack substrates, according to an embodiment.

Referring now to FIG. 24, an operational flowchart illustrating a method 400 for stacking substrates is shown, according to an exemplary embodiment.

High Density Substrate Layers (HDSL) may be built, block 402. The HDSL may be as described above regarding the thin film substrate 18. Metal posts may be attached to a lower surface of the HDSL, as described regarding the metal posts 102 above. The metal posts may be metal pads or pillars of copper (Cu), nickel (Ni), gold (Au), or other conduction metal or metal composition. The HDSL may be tested.

An upper surface of the HDSL may be attached to a handler, such as the handler 106 described above, using alignment marks on the handler, block 404.

An interconnect layer, such as the interconnect layer 16, may be attached to an upper surface of a substrate, such as the base substrate 12, block 406. The interconnect layer may have through holes and optional jogs or spacings which align with contacts and vias on an upper surface of the substrate. Solder paste or solder studs may be positioned in the through holes or openings of the interconnect layer with RDL adjustment wire or pads adjacent to ceramic vias with dielectric layer and or planarized ceramic surface layer or planarized thin film interconnect adhesive layer. The interconnect layer may include re-distribution layers (RDL) with jogs to support electrical connection between layers and corresponding power or signal wiring pads. Ceramic vias are electrical conductors such as copper, molybdenum or tungsten or alternate metals that pass through the ceramic dielectric layers such as glass, ceramic, cordierite, alumina or alternate dielectric. The ceramic material can be planarized such as with grinding, polishing or alternate method. The planarized thin film layer can be a single or dual damascene thin film layer or the "planar" surface of thin film released from a handle wafer or panel used for build of the structure and then released, flipped and released/joined to the ceramic or alternate substrate surface with a dielectric adhesive and electrical interconnections such as solder.

An amount of solder in each of the openings may be adjusted to capture different heights of external pads or vias on the upper surface of the substrate or on the lower surface of the HDSL, or adjustment jogs or pads of the interconnect layer.

The HDSL may be aligned and attached to the substrate, block 408, using alignment marks or the metal posts on the HDSL and alignment marks or the solder studs on the substrate.

Heat and pressure bond of the HDSL, the interconnect layer and the substrate may be done, block 410, at a temperature above the solder melting point. The total volume of the solder studs and the metal posts should be less than or equivalent than that of each of the openings of the interconnect layer. The combined handler, HDSL, interconnect layer and the substrate should be held in position until the solder solidifies.

The handler may be removed once the solder solidifies, block 412. Electronic components may be mounted on the HDSL and electrically and mechanically connected. Each electronic component may be tested prior to mounting. Additional testing may be performed at each step of the process to confirm wiring and contacts of each component. Testing may include statistical partial testing or full testing to support multi-chip integration and perform rework to achieve high substrate and module yield.

Advantages include improved CTE match, flatness and rigidity compared to dense organic options. CTE values of the thin film substrate, the interconnect layer, the high-k substrate and the substrate are more closely matched to the chips because of their inherent material properties, leading to less warping during assembly/integration and reduced damage to the final structure during power cycling and heat cycles for soldering and improved reliability during product use.

There is greater flatness due to reduced CTE mismatch in low temperature joining processing of each thin film substrate during assembly/connecting to the layers of substrate such as with a lower temperature solder and dielectric adhesive. There is greater rigidity due the stiffness of a ceramic substrate and/or due to close match of CTE across the layers of the substrate stack leading to less bow or warpage than high CTE organic substrates.

This structure and method may be used for higher density bump pitch, for example for large 200 micron pitch and for under 10 to 40 micron pitch interconnect, for fine pitch line and space of 20 micron to less than 2 micron, on large scale substrates. Advantages include one pass lamination or integration/assembly with known good hardware, which provides a process with higher yield. The one pass lamination refers to combining the layers of the thin film substrate prior to attaching to the substrate. If needed for enhanced yield, known good hardware is used by testing the thin film substrate prior to attaching to the handler.

Further advantages include improved mechanical integrity compared to organic options and sealed joining interface. There is improved mechanical integrity with use of co-planar chip to substrate layers and from co-planar substrate layer to substrate layer. Optional solder seal bands around the perimeter of the package can provide improved reliability by sealing the structure by baking out moisture the structure and providing a moisture—metal barrier to minimize moisture entrapment.

Optionally, there may be integrated high density discrete capacitors or a high k component layer in the thin film substrate. Depending on decoupling capacitance requirements and specifications of components, either multiple discrete components or a high k dielectric layer may be used.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A composite substrate comprising:
   a base substrate comprising electrical connections on a lower surface, electrical connections on an upper surface, one or more wiring layers electrically connected between the lower surface and the upper surface;
   a set of high-k substrate layers electrically and mechanically connected to the upper surface of the base substrate, wherein each layer of the set of high-k substrate layers comprises wiring and vias which connect above and below each layer of the set of high-k substrate layers, wherein a set of one or more discrete decoupling capacitors are embedded into the set of high-k substrate layers; and
   a set of high density substrate layers electrically and mechanically connected to an upper surface of the set of high-k substrate layers, wherein each layer of the set of high density substrate layers comprises wiring and vias which connect above and below each layer of the set of high density substrate layers.

2. The composite substrate according to claim 1, wherein the base substrate comprises multiple ceramic layers, and the base substrate comprises power supply lines to the set of high density substrate layers.

3. The composite substrate according to claim 1, wherein the base substrate comprises one or more glass layers, and comprises one or more organic dielectric layers, and the base substrate comprises power supply lines available to the set of high density substrate layers.

4. The composite substrate according to claim 1, further comprising:
   an interconnect layer between the set of high density substrate layers and the base substrate which provides electrical connection between each upper contact of an upper surface of the composite substrate and each lower contact of a lower surface of the set of high density substrate layers.

5. The composite substrate according to claim 1, further comprising:
   one or more layers with embedded discrete components within the set of high density substrate layers.

6. The composite substrate according to claim 1, further comprising:
   one or more layers of the set of high density substrate layers comprises power supply lines of wiring and vias.

7. The composite substrate according to claim 1, further comprising:
   the set of high density substrate layers comprising test contacts and structures.

8. The composite substrate according to claim 1, wherein each layer of the set of high density substrate layers comprises wiring of two or more dimensions and vias of two or more dimensions.

9. A composite substrate comprising:
   a base substrate comprising a coefficient of thermal expansion (CTE) between 3 and 12 ppm/° Celsius, a surface area greater than 25 mm×25 mm, electrical connections on a lower surface, electrical connections on an upper surface, one or more wiring layers electrically connected between the lower surface and the upper surface;
   a set of high-k substrate layers electrically and mechanically connected to the upper surface of the base substrate, wherein each layer of the set of high-k substrate layers comprises wiring and vias which connect above and below each layer of the set of high-k substrate layers, wherein a set of one or more discrete decoupling capacitors are embedded into the set of high-k substrate layers; and
   a set of high density substrate layers electrically and mechanically connected to an upper surface of the set of high-k substrate layers, wherein each layer of the set of high density substrate layers comprises wiring and vias which connect above and below each layer of the set of high density substrate layers, wherein each layer of the set of high density substrate layers supports wiring of less than 2 micron up to about 10 micron width, and less than 2 micron to about 10 micron space between wires, wherein a pitch connectivity between the upper surface of the set of high-k substrate layers and a lower surface of the set of high density substrate layers supports less than 50 micron up to about 300 micron pitch, wherein the pitch connectivity on an upper surface of the set of high density substrate layers supports less than about 150 micron pitch.

10. The composite substrate according to claim 9, wherein the base substrate comprises multiple ceramic layers, and the base substrate comprises power supply lines to the set of high density substrate layers.

11. The composite substrate according to claim 9, wherein the base substrate comprises one or more glass layers, and comprises one or more organic dielectric layers, and the base substrate comprises power supply lines available to the set of high density substrate layers.

12. The composite substrate according to claim 9, wherein an interconnect layer between the set of high density substrate layers and the base substrate which provides electrical connection between each upper contact of an upper surface of the composite substrate and each lower contact of a lower surface of the set of high density substrate layers.

13. The composite substrate according to claim 9, wherein one or more layers with embedded discrete components within the set of high density substrate layers.

14. The composite substrate according to claim 9, further comprising:
   one or more layers of the set of high density substrate layers comprises power supply lines of wiring and vias,
   the set of high density substrate layers comprising test contacts and structures, and
   each layer of the set of high density substrate layers comprises wiring of two or more dimensions and vias of two or more dimensions.

* * * * *